(12) United States Patent
Otte

(10) Patent No.: US 9,945,901 B1
(45) Date of Patent: Apr. 17, 2018

(54) MEASURING AND CORRECTING NON-IDEALITIES OF A SYSTEM

(71) Applicant: ANALOG DEVICES, INC., Norwood, MA (US)

(72) Inventor: Eric Otte, Boston, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/296,251

(22) Filed: Oct. 18, 2016

(51) Int. Cl.
| | |
|---|---|
| H03M 1/06 | (2006.01) |
| G01R 31/28 | (2006.01) |
| G01R 31/3167 | (2006.01) |
| G01R 31/3177 | (2006.01) |

(52) U.S. Cl.
CPC ..... *G01R 31/2851* (2013.01); *G01R 31/3167* (2013.01); *G01R 31/3177* (2013.01)

(58) Field of Classification Search
CPC ............ G01R 31/2851; G01R 31/3177; G01R 31/3167; H03M 1/06; H03M 1/1023; H03M 1/203; H03M 1/207; H03M 1/0621; H03M 1/089; H03M 1/185; H03M 1/1071; H03G 3/3068
USPC ..................................... 341/118, 155, 50, 51
See application file for complete search history.

(56) References Cited

U.S. PATENT DOCUMENTS

| | | | | |
|---|---|---|---|---|
| 4,672,605 A * | 6/1987 | Hustig | .................... | H03M 5/12 370/201 |
| 5,081,462 A * | 1/1992 | Tachita | .................... | G01S 19/30 342/352 |
| 5,901,183 A * | 5/1999 | Garin | ...................... | G01S 19/22 375/343 |
| 6,272,189 B1 * | 8/2001 | Garin | ...................... | G01S 19/22 375/150 |
| 7,271,750 B1 | 9/2007 | Ali | | |
| 8,723,707 B2 | 5/2014 | Ali | | |
| 2002/0159533 A1 * | 10/2002 | Crawford | ............ | H04L 27/2657 375/260 |

(Continued)

OTHER PUBLICATIONS

Mutsuo Daito et al., *A 14-bit 20-MS/s Pipelined ADC with Digital Distortion Calibration*, IEEE Journal of Solid-State Circuits, vol. 41, No. 11, Nov. 2006, 7 pages.

(Continued)

*Primary Examiner* — Jean B Jeanglaude
(74) *Attorney, Agent, or Firm* — Patent Capital Group

(57) ABSTRACT

Many systems implement calibration schemes to measure and correct for the non-idealities. Such systems can be complex, which makes them impractical to implement since the cost can potentially outweigh the benefits of the calibration scheme. To implement efficient and effective calibration, non-idealities or errors of a system are detected, in foreground or in background, in a piecewise fashion based on, e.g., correlations of an output signal with an uncorrelated random signal, where the correlation results are processed separately for different open intervals of an error signal. Second order and third order correction terms can be easily determined based on three open intervals. In various embodiments, the calibration scheme can detect and correct for linear errors, (linear and non-linear) memory/frequency dependent errors, static nonlinearity errors, Hammerstein-style non-linearity errors, and Wiener-style non-linearity errors (cross-terms).

20 Claims, 26 Drawing Sheets

(56) References Cited

U.S. PATENT DOCUMENTS

2015/0280725 A1* 10/2015 van Engelen .......... H03M 1/38
                                                                 341/118

OTHER PUBLICATIONS

Boris Murmann et al., *A 12-bit 75-MS/s Pipelined ADC Using Open-Loop Residue Amplification*, IEEE Journal of Solid-State Circuits, vol. 38, No. 12, Dec. 2003, 11 pages.

Parastoo Nikaeen et al., *Digital Compensaion of Dynamic Acquisition Errors at the Front-End of High-Performance A/D Converters*, IEEE Journal of Selected Topics in Signal Processing, vol. 3, No. 3, Jun. 2009, 10 pages.

Andrea Panigada et al., *Digital Background Correction of Harmonic Distortion in Pipelined ADCs*, IEEE Transactions on Circuits and Systems—I: Regular Papers, vol. 53, No. 9, Sep. 2006, 11 pages.

Bibhu Datta Sahoo et al., *A 12-Bit 200-MHz CMOS ADC*, IEEE Journal of Solid-State Circuits, vol. 44, No. 9, Sep. 2009, 15 pages.

Jie Yuan et al., *Background Calibration with Piecewise Linearized Error Model for CMOS Pipeline A/D Converter*, IEEE Transactions on Circuits and Systems—I: Regular Papers, vol. 55, No. 1, Feb. 2008, 11 pages.

Yun Chiu et al., *Least Mean Square Adaptive Digital Background Calibration of Pipelined Analog-to-Digital Converters*, IEEE Transactions on Circuits and Systems—I: Regular Papers, vol. 51, No. 1, Jan. 2004, 9 pages.

Jen-Lin Fan et al., *A Robust and Fast Digital Background Calibration Technique for Pipelined ADCs*, IEEE Transactions on Circuits and Systems—I: Regular Papers, vol. 54, No. 6, Jun. 2007, 11 pages.

John P. Keane et al., *Background Interstage Gain Calibration Technique for Pipelined ADCs*, Solid State Research Laboratory, Department of Electrical and Computer Engineering, University of California, 2004, 33 pages.

Jipeng Li et al., *Background Calibration Techniques for Multistage Pipelined ADCs with Digital Redundancy*, IEEE Transactions on Circuits and Systems—II: Analog and Digital Signal Processing, vol. 50, No. 9, Sep. 2003, 8 pages.

Jun Ming et al., *An 8b 80MSample/s Pipelined ADC with Background Calibration*, University of California, Davis, CA, 2000 IEEE International Solid-State Circuits Conference, 3 pages.

J. Yuan et al., *A 50MS/s 12-bit CMOS Pipeline A/D Converter with Nonlinear Background Calibration*, IEEE 2005 Custom Integrated Circuits Conference, 4 pages.

Jie Yuan et al., *A 12-bit 20 MS/s 56.3 mW Pipelined ADC with Interpolation-Based Nonlinear Calibration*, IEEE Transactions on Circuits and Systems—I: Regular Papers, vol. 59, No. 3, Mar. 2012, 11 pages.

* cited by examiner

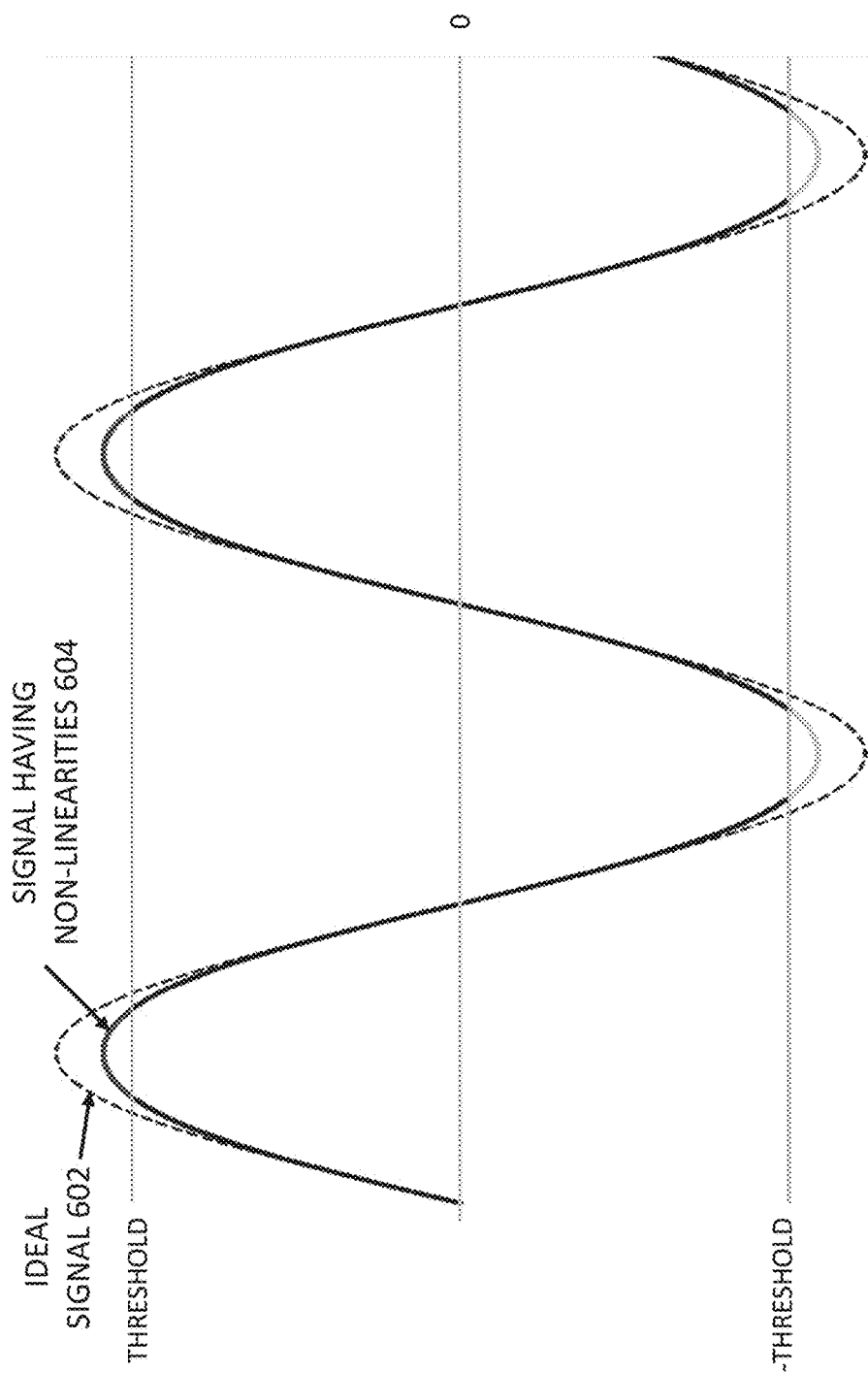

MEASURING AND CORRECTING NON-IDEALITIES OF A SYSTEM

TECHNICAL FIELD OF THE DISCLOSURE

The present disclosure relates to the field of integrated circuits, in particular to measuring and correcting non-idealities of a system.

BACKGROUND

In many electronics applications, an analog-to-digital converter (ADC) converts an analog input signal to a digital output signal, e.g., for further digital signal processing or storage by digital electronics. Broadly speaking, ADCs can translate analog electrical signals representing real-world phenomenon, e.g., light, sound, temperature, electromagnetic waves, or pressure for data processing purposes. For instance, in measurement systems, a sensor makes measurements and generates an analog signal. The analog signal would then be provided to an ADC as input to generate a digital output signal for further processing. In another instance, a transmitter generates an analog signal using electromagnetic waves to carry information in the air or a transmitter transmits an analog signal to carry information over a cable. The analog signal is then provided as input to an ADC at a receiver to generate a digital output signal, e.g., for further processing by digital electronics.

Due to their wide applicability in many applications, ADCs can be found in places such as broadband communication systems, audio systems, receiver systems, etc. Designing an ADC is a non-trivial task because each application may have different needs in performance, power, cost and size. ADCs are used in a broad range of applications including Communications, Energy, Healthcare, Instrumentation and Measurement, Motor and Power Control, Industrial Automation and Aerospace/Defense. As the applications needing ADCs grow, the need for fast yet accurate conversion also grows. Designing an ADC, especially an ADC which meets dynamic performance requirements and is low power, can be a complex and challenging task.

BRIEF DESCRIPTION OF THE DRAWING

To provide a more complete understanding of the present disclosure and features and advantages thereof, reference is made to the following description, taken in conjunction with the accompanying figures, wherein like reference numerals represent like parts, in which:

FIGS. 6A-B illustrate using two or three open intervals to determine correction terms, according to some embodiments of the disclosure;

DESCRIPTION OF EXAMPLE EMBODIMENTS OF THE DISCLOSURE

Overview

Figure 1:
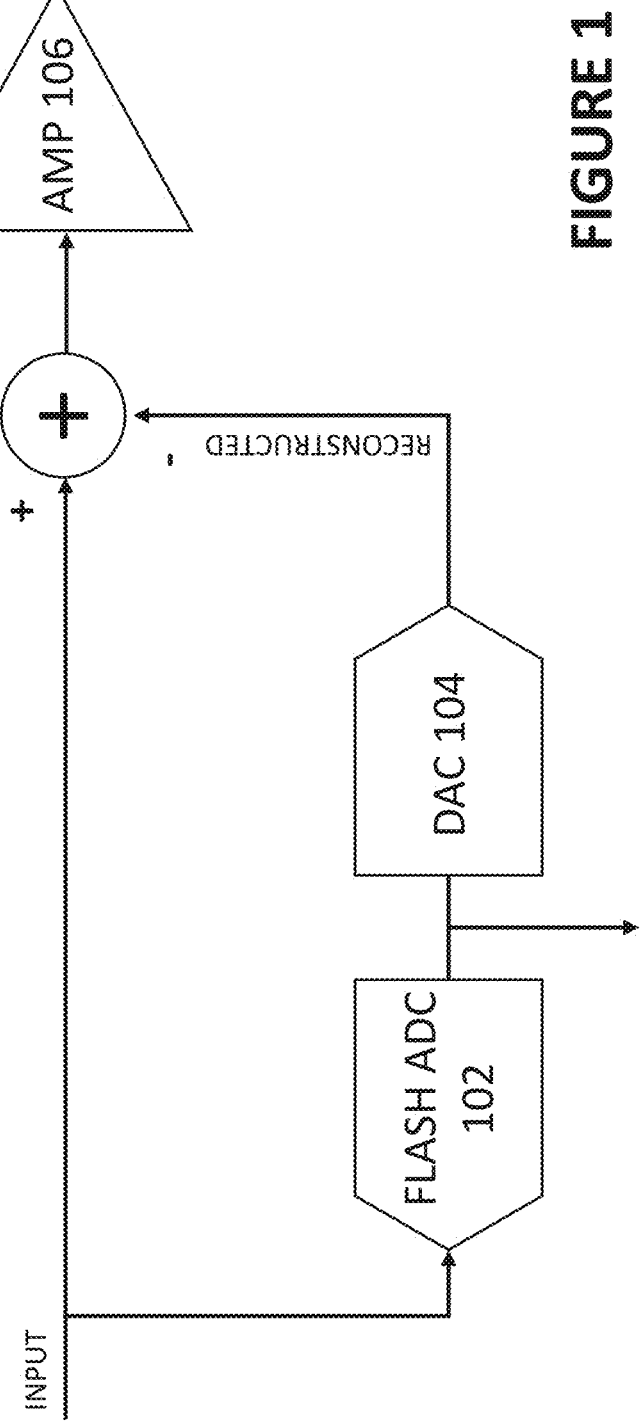
FIG. 1 illustrates an exemplary stage in a pipeline analog-to-digital converter.

Many systems implement calibration schemes to measure and correct for the non-idealities. Such systems can be complex, which makes them impractical to implement since the cost can potentially outweigh the benefits of the calibration scheme. To implement efficient and effective calibration, non-idealities or errors of a system are detected, in foreground or in background, in a piecewise fashion based on, e.g., correlations of an output signal with an uncorrelated random signal, where the correlation results are processed separately for different open intervals of an error signal. Second order and third order correction terms can be easily determined based on three open intervals. In various embodiments, the calibration scheme can detect and correct for linear errors, (linear and non-linear) memory/frequency dependent errors, static nonlinearity errors, Hammerstein-style non-linearity errors, and Wiener-style non-linearity errors (cross-terms).

Non-Linear Systems and Equalization

In electronics design, it is often preferable to have a linear system or ideal system. For example, a linear amplifier with a particular gain should have an output that is proportional to the input across the whole range of the input or output. In reality, many amplifiers may not have a constant gain across the whole range of the input or output, resulting in a non-linear amplifier. For instance, some amplifiers may have gain compression, meaning the gain at the ends of the range (i.e., near full scale) is typically slightly smaller than the gain in the middle of the range. Non-idealities, such as non-linearities or other types of errors can affect the performance of a system since these non-idealities can introduce errors. In many cases, improving the linearity of the system would typically require a more complex circuit design (in many cases requiring more design time), or linearity might come at the expense of power efficiency. Besides linearity, some circuits must meet requirements such that the filter response is of a response type other than a linear filter response.

Schemes for pre-distortion and post-distortion have been used to improve the linearity of a circuit, or more broadly, equalize the response of the circuit to achieve a desired filter response. These schemes model the circuit by sensing a signal and either adjusting an input signal (i.e., pre-distortion) or correcting an output signal (i.e., post-distortion) to correct for the non-linearities or achieve the desired filter response. One example is digital pre-distortion used to linearize a response in an amplifier in a transmitter. Another example is digital post-distortion used to linearize a signal received in a wireless receiver.

Many systems can be non-linear, or may need equalization, calibration, or correction. In audio systems, circuits and systems often have non-linear components, and the quality of audio signals, power consumption, and algorithms processing audio signals can be greatly affected by linearity. In wired and wireless telecommunications, non-linear circuits and propagation mediums are preferably linear. In control systems, algorithms often assume or require parts of the system to be linear to operate properly. In circuit design, components such as amplifiers are preferably linear or ideal (i.e., substantially free of undesirable errors).

Example of Circuit Having Non-Idealities

Analog-to-digital converters (ADCs) are electronic devices that convert a continuous physical quantity carried by an analog signal to a digital output or number that represents the quantity's amplitude (or to a digital signal carrying that digital number). An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal-to-noise-and-distortion ratio (SINAD), effective number of bits (ENOB), signal to noise ratio (SNR), total harmonic distortion (THD), total harmonic distortion plus noise (THD+N), and spurious free dynamic range (SFDR). ADCs have many different designs, which can be chosen based on the application requirements and performance specifications.

One group of ADCs are multi-stage ADCs, such as pipeline ADCs and multi-stage noise shaping delta sigma ADCs. Through pipelining, each stage resolves parts of the digital output word with high throughput. FIG. 1 illustrates an exemplary stage in a pipeline analog-to-digital converter. A stage generates a residue signal, which represents a difference between the input to the stage ("INPUT") and a reconstructed version of the input ("RECONSTRUCTED"). In this particular example, the input is an analog signal. The input is digitized coarsely by a flash ADC 102, and a digital output of the flash ADC 102 is converted back into an analog signal, i.e., the reconstructed version of the input, by a digital-to-analog converter 104. The residue is gained up by an appropriate factor by the amplifier 106, and the gained up residue ("y") is digitized by a next stage.

Figure 2:
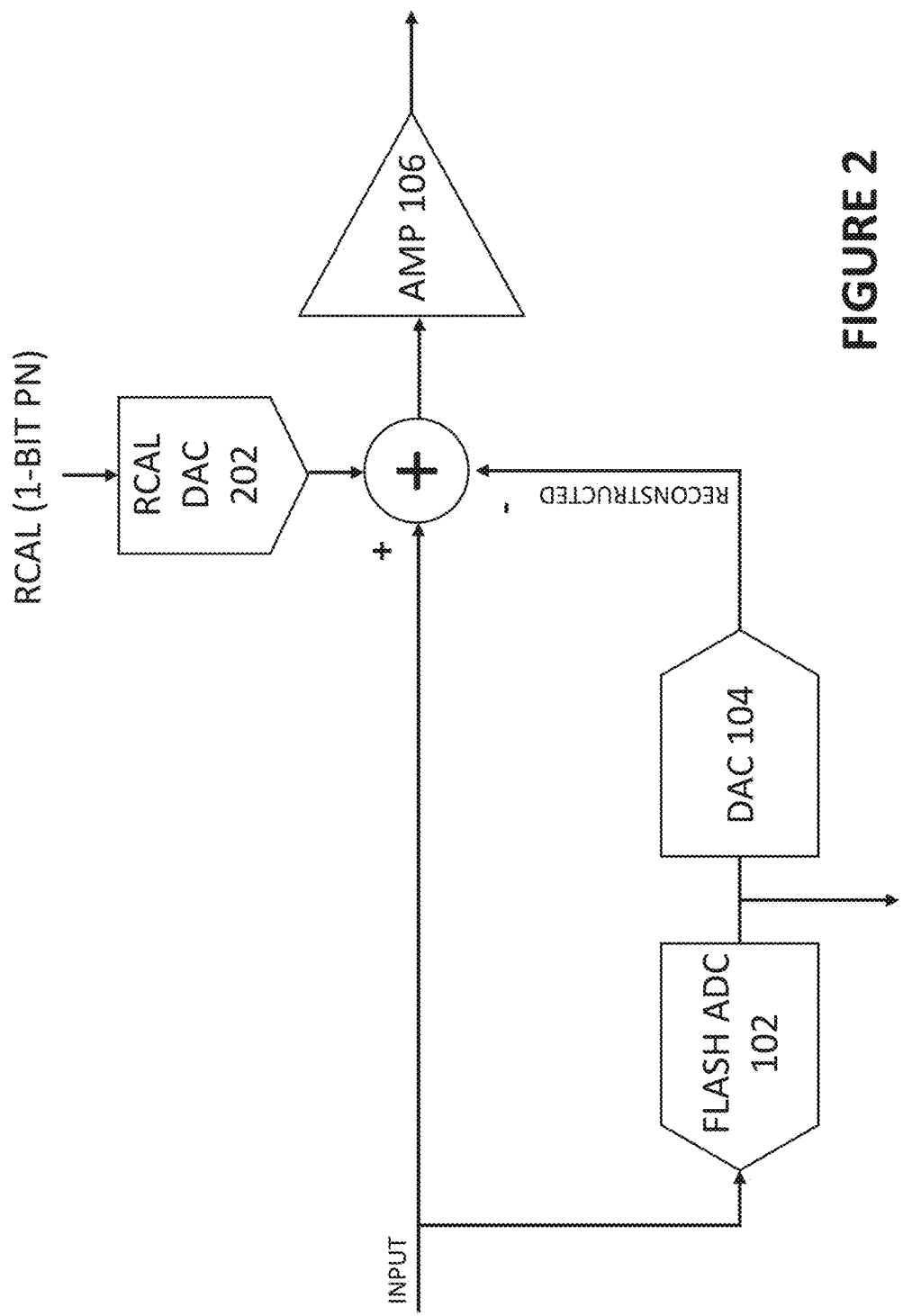
FIG. 2 illustrates an exemplary stage in a pipeline analog-to-digital converter having an injected signal for measuring characteristics of the amplifier, according to some embodiments of the disclosure.

In some cases, the actual linear gain of the amplifier is different from the ideal linear gain. Even if an amplifier can be made as linear as possible, linear gain can still drift over time due to temperature, voltage, etc. FIG. 2 illustrates an exemplary stage in a pipeline analog-to-digital converter having an injected signal for measuring characteristics of the amplifier, according to some embodiments of the disclosure. One approach to addressing a linear gain error in the stage is to inject a single bit pseudo-random signal generated by DAC 202 based on a 1-bit pseudo-random number sequence as input to the DAC 202 ("RCAL"). Both the single bit pseudo-random signal and the 1-bit pseudo-random number sequence are referred herein generally as RCAL, or 1-bit PN. RCAL can be injected at the summing node in front of the input of amplifier 106 (or some other circuit of interest). A digital weight of a bit of the RCAL signal can be measured (e.g., by a backend converter stage in a pipeline ADC) at startup to establish a baseline measurement of the signal being injected. During operation, the RCAL signal can be subtracted out (since the 1-bit PN signal and a baseline measurement of the bit are known) from a digital residue output y[n] (i.e., a digitized version of the residue output signal y(t) from amplifier 106) to generate an error signal. Note that the RCAL signal is not correlated with the signal being processed by the stage, and thus, the correlation of the error signal to the RCAL signal can provide an estimate of the linear gain or the linear gain error, e.g., using an update algorithm for a least means squared filter. Any deviation in the digital weight of a bit of the RCAL signal from the baseline would appear in the correlations, and is assumed to be from a change or deviation in the amplifier gain. An exemplary formula for deriving an estimating or updating of the linear gain estimate can be the following:

$$\propto[n]=\propto[n-1]+\mu*\Sigma[(yc-PN)*PN] \quad (1)$$

In equation (1), $\propto[n]$ represents the linear gain; (yc−PN) represents the error signal, which is the residue output signal minus the 1-bit PN/RCAL signal. Since this update formula adaptively adjusts the residue output signal (i.e., to drive the "error" to zero as the estimate for the correction term improves), (yc−PN) represents the "corrected" residue output signal minus the 1-bit PN/RCAL signal. The error signal (yc−PN) is correlated with the RCAL signal PN, i.e., (yc−PN)*PN. If there are no deviations from the ideal gain, the statistics of the correlations would have a zero mean. If there are deviations from the ideal gain, the statistics of many correlations, e.g., $\Sigma[(yc-PN)*PN]$, would have a non-zero mean. Based on the statistics on the correlations, a correction term to address deviations from an ideal gain can be determined and updated over time. The weight of the 1-bit PN/RCAL signal is fixed, and the adaptive calibration scheme illustrated by the update equation (1) aims to correct for gain errors of the system so that the 1-bit PN/RCAL signal can be subtracted from the corrected residue perfectly (i.e., driving the "error" to zero). $\mu$ is a parameter for step size in equation (1), which governs how quickly the update algorithm updates. For instance, if the linear gain of the amplifier is expected to be 4, the update algorithm can determine whether the linear gain of the amplifier is 4.1, deviating from the ideal value of 4.

In some cases, the amplifier 106 may have (linear) frequency/memory dependent errors which depend on leading or lagging samples, and the update algorithm mentioned above would not be able to adequately account for those errors. More often than not, the amplifier 106 is not linear (in addition to have an linear gain error or linear frequency/memory dependent errors), which means the gain of the amplifier 106 can vary non-linearly depending on the input, e.g., compresses near full scale (ends of the full range) and have saturation effects, and even vary non-linearly depending on leading and/or lagging samples. The scheme mentioned above (without any further modifications) would not be able to adequately account for such non-linearities.

Figure 3:
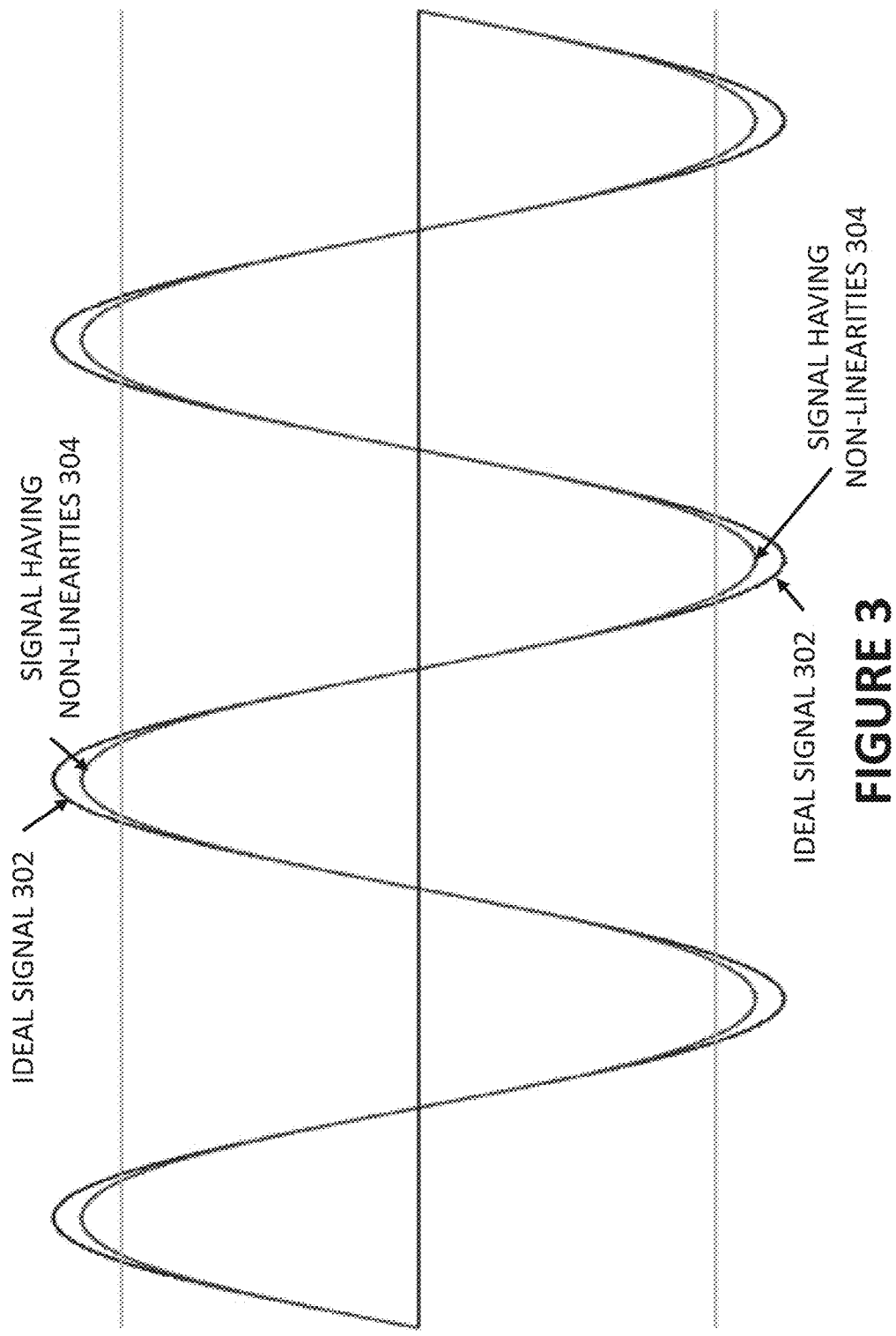
FIG. 3 illustrates an ideal signal versus a signal having non-linearities.

FIG. 3 illustrates an ideal signal 302 versus a signal having non-linearities 304. It can be seen from the FIGURE that signals experiences gain compression near the edges of its input/output range. At the signal peaks, the amplitude of the signal is smaller for the signal having non-linearities 304 than the ideal signal 302. Gain errors can cause integral non-linearity errors and tones. If the application requires high performance such as high SFDR, non-idealities in the amplifier of the stage can be very undesirable. While in some cases, one can trade off linearity with power, but one may not always want to make such a trade off when the application requires low power operation. As circuit designs move into smaller process nodes and higher speeds, building a more ideal amplifier, buffer, or other circuit parts can become more challenging, thereby requiring a lot more effort to design. Even if the amplifier is designed to be as free of non-idealities as possible, non-idealities can appear over time due to temperature, voltage, aging, etc.

Modeling a System

Various models can be used to model the non-idealities of a system. The model can be used for characterizing a system and for determining correction terms usable to correct the signals to achieve a linear response or some other desirable response.

The most basic non-linear error model is a static non-linearity model. The model implies that the non-linear effects of the system are dependent only on a current input to the device, which means the non-linear effects are constant across frequency. An example of such model relating the input x[n] to the output y[n] can be as follows:

$$y[n]=\alpha x[n]+\beta x[n]^3 \qquad (2)$$

In equation (2), $\alpha$ is the coefficient for the linear term, and $\beta$ is the coefficient for the non-linear term. The static non-linearity model can have terms of different orders. x[n] is a first order term, $x[n]^2$ is a second order term, $x[n]^3$ is a third order term, and so on. Typically odd-order nonlinearities (gain compression for both positive and negative inputs) dominate, while even-order nonlinearities (different gain for positive vs negative) are minimized by differential operation of a circuit.

Besides static non-linearity, some systems may have (linear) frequency/memory dependent errors, where the errors of system can depend on future or past input to the device. An example of such a model relating the input x[n] to the output y[n] can be expressed as follows:

$$y[n]=\alpha x[n]+\beta_{-1}x[n-1]+\beta_{+1}x[n+1] \qquad (3)$$

In the model illustrated by equation (3), the model expresses that the output y[n] can be dependent on leading samples of the input x[n+T] and lagging samples of the input x[n−T].

One exemplary non-linear error model is a Hammerstein model, which comprises a static non-linearity followed by a finite impulse response (FIR) filter. An example of such model relating the input x[n] to the output y[n] can be expressed as follows:

$$y[n]=\alpha x[n]+\beta_{+1}x[n+1]^3+\beta_0 x[n]^3+\beta_{-1}x[n-1]^3 \qquad (4)$$

In the model illustrated by equation (4), the model expresses that the output y[n] can be dependent on leading samples of the input x[n+T] and lagging samples of the input x[n−T]. Such terms can be characterized as (non-linear) frequency/memory dependent error terms. A more complicated Hammerstein model is the Parallel-Hammerstein model, which expands upon the Hammerstein model by summing parallel paths for linear and higher-order non-linearities.

Yet another exemplary non-linear error model is the Wiener non-linear model, which comprises an FIR filter followed by a static non-linearity. An example of such model relating the input x[n] to the output y[n] can be as follows:

$$y[n]=\alpha x[n]+\beta_{+1}x[n+1]^3+\beta_0 x[n]^3+\beta_{-1}x[n-1]^3+\gamma_{0,1}x[n+1]^2 x[n]+\gamma_{1,0}x[n]^2 x[n+1] \qquad (5)$$

In the model illustrated by equation (5), the model expresses that the output y[n] can be dependent not only on leading samples of the input x[n+T] and lagging samples of the input x[n−T], the output y[n] can be dependent on "cross-terms", which are non-linear combinations of current sample x[n], leading sample x[n+T], and lagging sample x[n−T] of the input (e.g., $\gamma_{0,1}x[n+1]^2 x[n]$ and $\gamma_{1,0}x[n]^2 x[n+1]$ as seen in the example).

In the examples explained above, the various terms effectively form a filter being applied to x[n] and x[n] passed through non-linear functions. A calibration scheme aims to estimate the filter so that corrections can be applied to correct the signal, so that the non-idealities are "removed" or effects of which are reduced. Determining the coefficients for these various terms in the model is not trivial. With unlimited amount of computational resources, it is possible to readily determine these terms. However, it is counterproductive to expend computational resources when the goal is to linearize the circuit to ultimately reduce power consumption.

The present disclosure describes a digital calibration scheme for detecting and correcting for errors such as, linear gain error, (linear and non-linear) memory/frequency dependent error, static non-linearity error, Hammerstein-style non-linearity errors, and Wiener-style non-linearity errors (cross-terms). The digital calibration scheme performs efficiently, and can be performed in the background (during normal operation of the circuit). Similar to the linear gain error detection scheme described in relation to FIG. 2, a 1-bit PN or RCAL signal can be used. Instead of just correcting for the linear gain error, the 1-bit PN or RCAL enables the above mentioned errors to be estimated. The 1-bit PN, or RCAL signal is injected at the summing node in front of the amplifier. If the amplifier has gain compression, RCAL signal present at the output of the amplifier is expected to be slightly bigger when the residue signal is zero, than when the residue signal is close to the ends of the range. The calibration scheme takes many samples measuring this RCAL signal to estimate non-linearity of the amplifier.

To ensure the detection and correction schemes are efficient, a piecewise approach is used, where correction terms (e.g., gain and offset correction terms) are determined based on correlations sorted according to an amplitude of the current sample of an error signal and potentially the neighboring samples of an error signal (or even product of current and neighboring samples of the error signal). The error signal, err[n], can represent a corrected output signal (e.g., a corrected residue output signal) with the 1-bit PN/RCAL signal removed, i.e., err[n]=yc[n]−PN[n]). The result is a highly scalable and efficient calibration scheme usable for a variety of non-ideal systems.

Piecewise Approach Using Open-Intervals

A piecewise approach makes for a simple-to-implement and efficient digital calibration scheme. The piecewise approach can be modified to account for different types of errors, by varying the signals used in the correlations and varying the update algorithms. Such an approach may not have to assume model order or a particular type of model. However, designing an implementation for such approach is not so trivial. Consider the detection and correction of a static non-linearity, in which the non-linearity is only due to the amplitude of the current sample $y[n]=\alpha x[n]+\beta x[n]^3$. $\alpha$ is the nominal linear gain coefficient and $\beta$ is the non-linear gain coefficient. From the equation, one can see that the gain $y[n]/x[n]$ depends on a constant plus the magnitude squared of the current sample. Typically $\beta$ would be negative for gain compression, i.e. saturation near full-scale. The piecewise approach to detect and correct for non-idealities is to divide the error signal, e.g., (err[n]=yc[n]−PN[n]) into a number of open intervals, i.e., L overlapping open intervals based on amplitude, detect the gain in each open interval, and apply a piecewise-linear gain correction (and offset) to the output of the circuit y[n] (e.g., residue signal) based on closed intervals to correct for the non-idealities.

A goal of implementing a piecewise estimation of the system is to determine the gain in each piece, or closed interval, of the signal range, so that the gain can be corrected in a piecewise fashion, where correction can be applied differently to each piece or closed interval of the signal range. However, detecting the gain in an interval of the error signal err[n] is not straightforward. For non-piecewise, linear gain calibration, the estimation of the gain would operate on the entire residue, i.e., the entire error signal, and no intervals are applied, and uses the difference in statistics between when PN=+1 and PN=−1 to drive a gain correction loop. If the error signal err[n] is segmented into closed intervals (e.g., $s_{int1closed}[z]$:int[1]<s[k]<int[2], s[k] being a signal of interest being segmented), the data where PN=+1 and PN=−1 by definition overlap in each closed interval, and the statistics would reveal zero information. In other words, estimating the gain would be impossible if the statistics are accumulated based on closed intervals. In the present disclosure, the intervals being used for piecewise estimation or error detection are open intervals, not closed intervals. Besides using an open interval, the 1-bit PN/RCAL signal is preferably subtracted before applying the open interval threshold logic to minimize correlation between the 1-bit PN/RCAL signal with the interval.

Choice of open intervals and the number of open intervals L can vary depending on the type of error to be corrected. When a signal of interest, s[k], has a full range centered around zero, exemplary open intervals can include:

$s_{openpos}[z]$:0<s[k]

$s_{int1pos}[z]$:int[1]<s[k]

$s_{int2pos}[z]$:int[2]<s[k]

. . .

$s_{openneg}[z]$:s[k]<0

$s_{int1neg}[z]$:−int[1]>s[k]

$s_{int2neg}[z]$:−int[2]>s[k]

. . . (6)

In the set of interval definitions (6) above, $s_{openpos}[z]$ and $s_{openneg}[z]$ represents a positive open interval and a negative open interval of an "unfiltered" interval, which together comprises of all s[k] samples. int[ ] can store a list of threshold values (in this example, a list of non-zero positive values dividing the range of the residue). s[k] would fall within a first positive interval $s_{int1pos}[z]$ if amplitude of s[k] is greater than (or greater than or equal to) a first positive threshold value int[1]. s[k] would fall within a second positive interval $s_{int2pos}[z]$ if amplitude of s[k] is greater than (or greater than or equal to) a second positive threshold value int[2]. s[k] would fall within a first negative interval $s_{int1neg}[z]$ if amplitude of s[k] is less than (or less than or equal to) a first negative threshold value −int[1]·s[k] would fall within a second negative interval $s_{int2neg}[z]$ if amplitude of s[k] is less than (or less than or equal to) a second negative threshold value −int[2]. One feature associated with these open intervals is that they can overlap each other (e.g., two or more intervals can overlap each other). Phrased differently, one particular sample s[k] can fall under one or more open intervals. A reasonable number of positive intervals and a reasonable number of negative intervals can be used. The (positive and negative) threshold values dividing the range can be selected on significant bit levels to lower cost and reduce unnecessary complexity. A square-root interval spacing, or having more closely spaced interval thresholds near the ends of the ranges can provide for better calibration.

In general, a circuit with even-order effects can mean that the non-linearities for the positive interval(s) is different from the negative interval(s). Therefore, different correction terms would be needed for the positive intervals and negative intervals.

If even-order effects are expected to be negligible, then the intervals can be applied to the absolute value or the magnitude of the signal of interest s[k]:

$s_{open}[z]$:0<abs(s[k])

$s_{int1\_folded}[z]$:int[1]<abs(s[k])

$s_{int2\_folded}[z]$:int[2]<abs(s[k])

. . . (7)

The above intervals in the set of interval definitions (7) mean that negative and positive values of s[k] having the same magnitude would get the same correction term(s) (assuming the positive intervals and the negative intervals have the same gain error). This simplification can reduce the number of intervals and circuitry needed for the calibration scheme. If the system utilizes differential circuit design, even-order non-linearities can be negligible. The dominant non-linearities would be due to odd-order distortion such as $x^3[n]$ (e.g., gain compression equally for positive and negative full-scale), and even-order effects would be negligible. While some of the examples herein makes this simplification, it is understood by one skilled in the art that the teachings of the disclosure can be extended to account for the even-order non-linearities by using separate positive interval(s) and negative interval(s).

Figure 4:
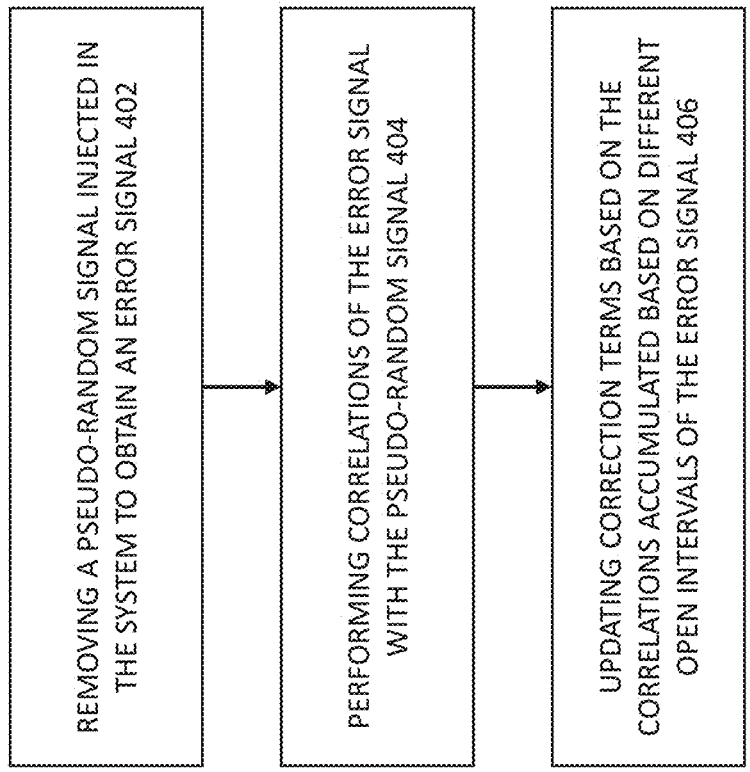
FIG. 4 is a flow diagram illustrating a method for determining correction terms using the piecewise approach, according to some embodiments of the disclosure.

FIG. 4 is a flow diagram illustrating a method for determining correction terms of a system using the piecewise approach, according to some embodiments of the disclosure.

The correction terms can be associated with any one or more of the following: linear errors, (linear and non-linear) memory/frequency dependent errors, static nonlinearity errors, Hammerstein-style non-linearity errors, and Wiener-style non-linearity errors (cross-terms).

A pseudo-random signal (PN[n]) is injected into a system. The system can be a circuit having non-linearities, such as a stage in a pipeline ADC where the residue amplifier may be non-linear. The pseudo-random signal would be injected at a part of the circuit, so that the pseudo-random signal can be processed along with another (normal or special) input signal by the system. An example of injecting the pseudo-random signal into a stage of a pipeline ADC is illustrated by the RCAL DAC 202 of FIG. 2. Preferably, the pseudo-random signal is a 1-bit pseudo random signal (e.g., 1-bit PN or RCAL as explained with FIG. 2). The pseudo-random signal can be generated from a 1-bit pseudo-random number sequence of +1's and −1's. The pseudo-random sequence can be digitally generated or provided from a memory. A digital-to-analog converter can convert the sequence into analog form suitable to be injected into the system. The pseudo-random signal is not correlated with the input signal, thus allows for non-idealities of the system to be measured. The pseudo-random signal is injected into the system, e.g., at the summing node in front of the amplifier, or in front of a part of a circuit to be calibrated. The pseudo-random signal is then removed from a corrected output signal to obtain the error signal.

In task 402, a pseudo-random signal (PN[n]) injected in the system is removed, e.g., from a corrected output signal of the system, to obtain a signal. The resulting signal is generally referred to as the error signal err[n], because deviations from an ideal gain would appear in the error signal when the pseudo-random signal is not removed perfectly (meaning the model is not perfect yet). In mathematical terms, this operation for removing the pseudo-random signal can be represented by err[n]=yc[n]−PN[n]. yc[n] can be a "corrected" output signal or "corrected" residue signal in the case of a residue producing circuit, i.e., where yc[n] a signal that may already have some correction applied to it, when the calibration scheme uses an adaptive algorithm to update correction terms to drive the "error" to zero as it improves the error estimation.

In task 404, correlations of the error signal with the pseudo-random signal is performed, e.g., by a correlation block or a multiplier. For instance, a sample of the pseudo-random signal PN[n] is correlated with a sample of the error signal err[n], e.g., PN[n]*err[n]. A collection of correlations and its statistics can yield information for determining different correction terms.

In task 406, correction terms are updated based on the correlations accumulated based on different open intervals of the error signal. Phrased differently, one or more correction terms are computed based on correlation results sorted based on the different open intervals of the error signal. For instance, statistics, based on the sorted correlation results, such as mean, can yield information from which correction terms can be determined. The different open intervals is defined based on an amplitude of the error signal, e.g., the "corrected" residue of the residue producing circuit with the pseudo-random signal removed, or err[n]=yc[n]−PN[n]. Performing or processing correlations in piecewise fashion makes for an efficient and less complex calibration scheme since linear gain correction terms can estimate or approximate a complex non-linear system. The correlations would yield non-idealities of the system that can be calibrated out.

Many results of the correlations are stored, e.g., grouped based on the different open intervals so that an averaging operation can be performed to extract the non-idealities or errors of the system. Correction terms can be determined from the information extracted from the sorted correlations. The correlation operation, i.e., the specific samples being used for the correlation, can differ depending on the type of error to be detected. The number of open intervals can vary. In some embodiments, the number of intervals can be determined based on the expected non-linearity of the system.

When a sufficient number of correlations have been performed and results have been accumulated for a particular open interval, an update equation can be used to update one or more correction terms for a closed interval corresponding to the particular open interval. While correction term(s) are determined based on open intervals, the correction terms are separately applied to closed intervals corresponding to the different open intervals. In other words, error information is estimated based on a plurality of overlapping open intervals, and that error information obtained from the overlapping open intervals is mapped into correction term(s) for a plurality of non-overlapping closed intervals.

In some embodiments, the correction terms can calibrate for various types of gain errors of a stage in a pipeline ADC. The calibration scheme does not require a special input signal either (although this algorithm can operate in the foreground with a special input signal), and the scheme can be performed in the background during the normal operation of the system. If the system is a stage in a pipeline ADC, the calibration scheme can operate in the background during normal data conversion of the pipeline ADC. While it is not necessary, a large scale dither signal can be injected into the system to ensure a full range of the system is exercised to ensure correlations are being performed across the entire range for all the different open intervals.

Figure 5:
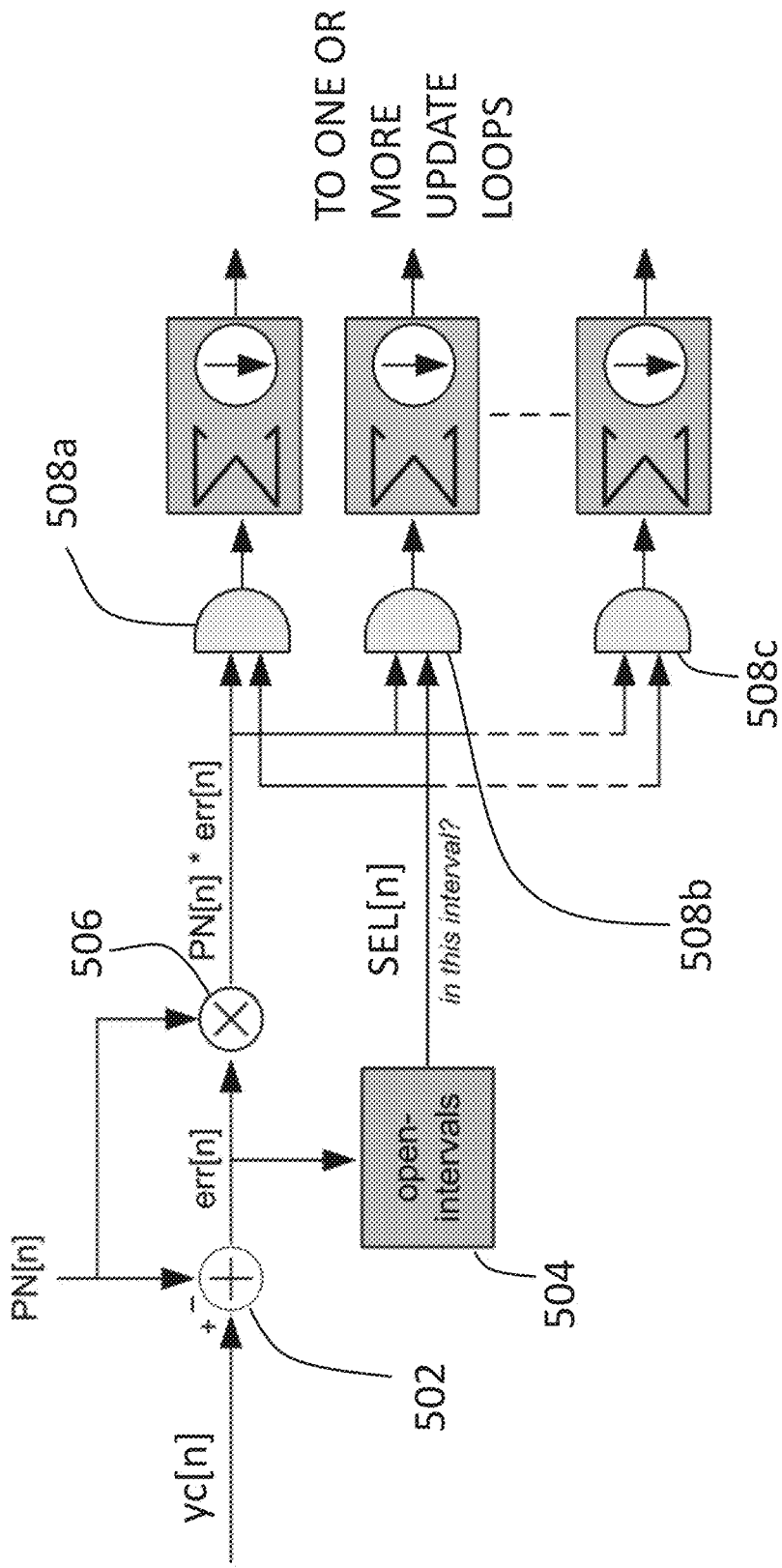
FIG. 5 illustrates an exemplary system for determining correction terms, according to some embodiments of the disclosure.

FIG. 5 illustrates an exemplary system for determining correction terms, according to some embodiments of the disclosure. The system can be used to correct a circuit generating a signal. The calibration system can have a plurality of piecewise-linear detection open intervals with separate update loops running in parallel. The circuit can be a residue producing circuit in an analog-to-digital converter, as illustrated by FIGS. 1-2, and thus the signal being generated by the circuit can be a residue signal.

The system includes a circuit part, e.g., a summation node 502, for removing an injected signal ("PN[n]") from a corrected output signal ("yc[n]"). For a residue producing circuit, the corrected output signal can be a corrected residue signal. The injected signal is uncorrelated with the signal being processed by the circuit (e.g., a data signal being converted by a stage in a pipeline, some other kind of input to the circuit to be calibrated). The injected signal can be, e.g., a pseudo-random signal, a 1-bit PN/RCAL signal. In the residue producing circuit example, the injected signal is injected at an input of an amplifier of the residue producing circuit. The correction terms are associated with gain errors of the amplifier. As shown in the example illustrated by FIG. 5, the injected signal PN[n] is removed from the corrected output signal yc[n] by the circuit part to generate an output signal err[n] as the error signal. The error signal is a "corrected output error" since the calibration scheme can continuously run over time to update the correction terms based on a corrected output signal yc[n].

In some embodiments, the system further includes threshold logic to determine whether an output signal from the circuit part (e.g., an error signal err[n] being generated by the circuit part) falls with one or more open intervals. The threshold logic can generate a selection signal, e.g., SEL[n], or suitable set of signals for indicating whether the output signal from the circuit part, e.g., err[n], fall within one or more open intervals. Threshold logic, such as comparators, can be used to compare the error signal against different threshold values. The threshold logic, e.g., open-intervals block 504, enables the correlations, e.g., PN[n]*err[n], to be sorted into one or more open intervals so that correlations can be accumulated separately for the different open intervals. In this particular digital circuit design, a signal can be generated for each open interval, where a "1" can indicate that the signal is within a particular open interval, and a "0" can indicate that the signal is not within a particular open interval. The threshold logic being implemented would differ depending on the number of open intervals to be used for modeling the system. In one example, the threshold logic operates on an absolute value ("abs(.)") or magnitude of the amplitude of the error signal (e.g., when even order effects are negligible). For a signal range centered around 0, both the positive and negative values having the same magnitude can be sorted into the same open interval. Such an implementation or simplification is particularly useful for systems where even-order non-linearities do not dominate.

The system further includes a correlation block 506 to correlate the error signal against the injected signal (e.g., obtaining PN[n]*err[n]), wherein correction terms for linearizing the circuit are generated based on correlations computed from the correlation block. The "AND" logic blocks, e.g., AND blocks 508a-c, receiving the selection signal SEL[n] (or suitable signals) and the correlation results PN[n]*err[n], can sort the correlation results based on one or more interval(s) in which the error signal falls. In the example shown, the sorted correlation results from correlation block 506 can be provided to one or more separate update loops. One or more update loops can be included for processing correlation results within one or more open intervals to generate correction terms for correcting the circuit.

In a non-linear system, the linear gain of the system vary as the amplitude of the signal varies. Linear gain can be estimated based on statistics of the correlation results of PN=+1 and PN=−1. The correlation results sorted based on the open intervals would estimate the linear gain for the respective open intervals, and the correction terms estimated from these different sets of correlation results corresponding to the different open intervals would differ from each other in a non-linear system. In one example, two sets of correlation results can be driven to be equal to each other to equalize the circuit. In another example, within an update loop, the correlation results can be accumulated to extract gain error within a particular open interval and update one or more correction terms accordingly. The specific implementation of the update loops depend on the calibration scheme and type of error to be detected. Exemplary calibration schemes are described in relation to FIGS. 6-7.

The piecewise calibration scheme works on processing the calibration results separately to generate correction terms based on the different open intervals via one or more update loops. The one or more update loops can receive or process the correlation results collected or "binned" based on the open intervals. In other words, the statistics of the correlation results where PN=+1 and PN=−1 gathered for the open intervals can be used to update correction terms for correcting the circuit.

Model Fitting for Non-Linearity Using Open Intervals

Figure 6B:
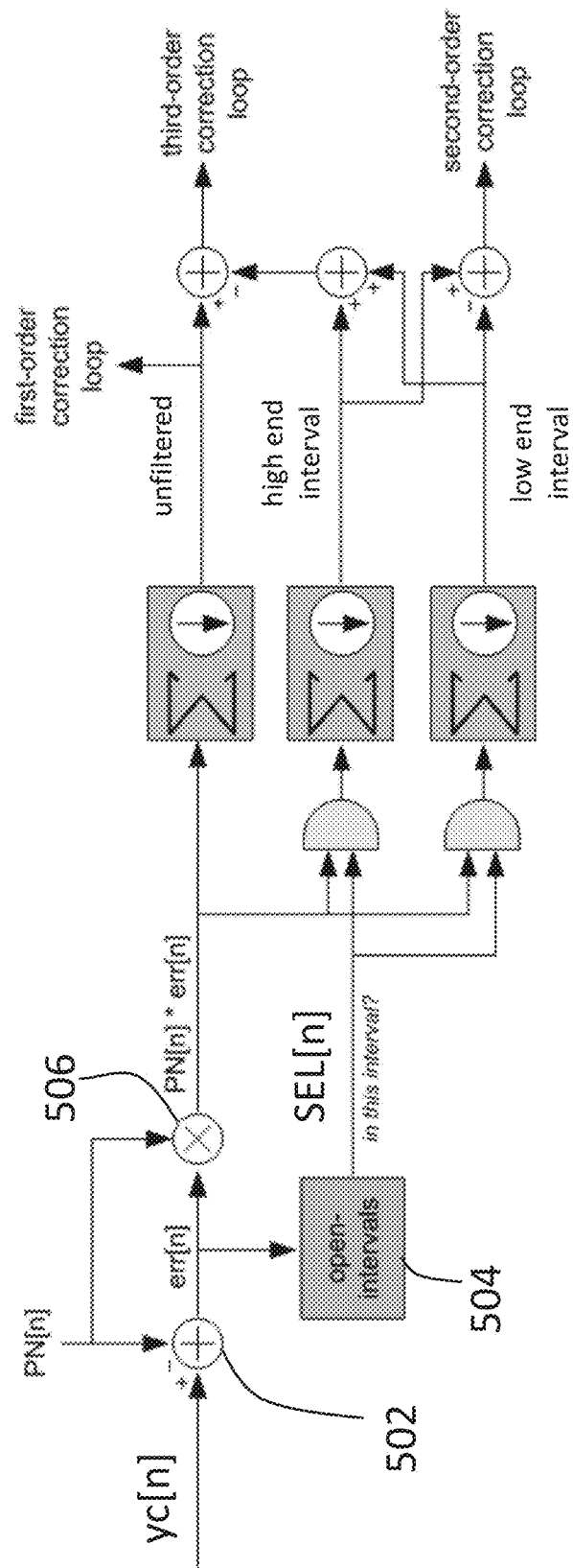

In many circuits, third order and possibly second order effects can dominate over higher orders. Therefore, it may be possible to correct primarily for third order distortions, and perhaps also for second order distortions if even-order effects are not negligible. In such cases, the calibration scheme can simply use two open intervals, or three open intervals if second order distortions are to be accounted for. FIG. 6A-B illustrate using two or three open intervals to determine correction terms, according to some embodiments of the disclosure. In FIG. 6A, consider the ideal signal 602 (solid line) and the signal having non-idealities 604 (dotted line). Near the ends of the signal range, i.e., a high end interval above "THRESHOLD", and a low end interval below "−THRESHOLD" (negative of the "THRESHOLD"), gain compression (a third order, odd-order effect) makes the signal having non-idealities 604 smaller than the ideal signal 602 at the high and low end intervals. If second order distortions (an even-order effect) are present, the gain in the high end interval would differ from the low end interval.

Generally speaking, second and third order effects may cause the signal experience different gain in different parts of the range. For instance, third order effects can cause the signal to experience different gain near the edges of the range than the gain experienced near zero amplitude. Accordingly, the gain experienced near zero amplitude can be used as reference, so that the gain across the range can be "equalized". In another instance, second order effects can cause the signal to experience different gain in the positive range versus the negative range. The gain experienced in a high end interval or the low end interval can be used as a reference for each other, so that the gains in the positive range and the negative range can be "equalized". To calibrate such a system, the update loop can force the gain of one open interval to be the same as a reference interval. As previously explained, the correlations can be run separately with the different open intervals. The separate correlations can estimate the gain for the open intervals; one or more update loops can leverage the different gain estimated to equalize the circuit.

FIG. 6B shows three sets of correlation results, e.g., PN[n]*err[n], being accumulated: "unfiltered interval", "high end interval" and "low end interval". The unfiltered interval includes correlation results associated with all values of err[n], i.e., the open interval includes all samples of the error signal. The high end interval includes correlation results associated with values of err[n]>threshold value, i.e., the open interval includes samples of the error signal greater than a first predetermined threshold value. The low end interval includes correlation results associated with values of err[n]<−threshold, i.e., the open interval includes samples or the error signal whose values are below a second predetermined threshold value (the second predetermined threshold value being of the same magnitude with the first predetermined threshold value but of opposite polarity). The correlations accumulated for the different open intervals can be used in one or more update loops, e.g., to estimate even-order and odd-order effects. FIG. 6B illustrates how the correlation results can be used to drive the first order correction loop, the second order correction loop, and the third order correction loop.

The unfiltered interval defined to include all samples of the error signal, i.e., all correlation results of the error signal with the 1-bit PN/RCAL signal, can be used for correcting first order effects.

If the even-order effects are negligible and odd-order effects dominate, the different overlapping intervals comprises: ("unfiltered interval") an interval including all samples (of the error signal, "err[n]"), and ("high-low interval") an interval including samples whose absolute value is above a first predetermined threshold value (e.g., "THRESHOLD"). Samples in the high end open interval and samples in the low end interval would fall within the same open interval ("high-low interval"). Updating the correction terms based on the correlations (i.e., separate sets of correlation results sorted based on the open intervals) would involve updating correction terms based on (1) correlations associated with interval including all samples, and (2) correlations associated with an interval including samples whose absolute value is above a first predetermined threshold value. To correct for the third-order distortions, an update loop based on the separate sets of correlation results on the two open intervals mentioned above, can estimate gain for the respective intervals. Correlation results from the high end interval and the low end interval are combined for the high-low interval. The gain estimated on the "unfiltered" interval serves as the reference gain. The update loop can drive, e.g., a third order static non-linearity correction term $b_{k=3}[r]$, until the gain estimate for "high-low interval" is equal to the reference gain estimated from the "unfiltered interval". An exemplary update equation for the update loop can be as follows:

$$\hat{b}_{k=3}[n] = \qquad (8)$$

$$\hat{b}_{k=3}[n-1] - \mu \frac{1}{N} \sum_{l=0}^{N-1} [err[l] * PN[l] - err_{high/low}[l] * PN_{high/low}[l]]$$

err[l] is the error signal (e.g., the corrected residue with the 1-bit PN/RCAL signal removed, or yc[n]−PN[n]). In update equation (8), $err_{high/low}[l]$ is the error signal within the "high-low" interval. PN[l] is the 1-bit PN/RCAL signal. err[l]*PN[l] is the reference term based on correlations performed with the "unfiltered interval". $err_{high/low}[l]$* $PN_{high/low}[l]$ is the high-low interval term based on correlations performed with the "high-low interval". This update loop is illustrated as the "third-order correction loop" in FIG. 6B. As the update loop runs, and the system becomes more "equalized"; the correlations at the edges, i.e., "the high-low interval" would be closer to the correlations from the "unfiltered interval". The update for the correction term would converge, as the update term, $$\mu \frac{1}{N} \sum_{l=0}^{N-1} [err[l] * PN[l] - err_{high/low}[l] * PN_{high/low}[l]],$$

in equation (8), approaches 0.

If the even-order effects are not negligible, the different overlapping intervals comprises: ("unfiltered interval") an interval including all samples (of the error signal, "err[n]"), ("high interval") an interval including samples whose values are above a first predetermined threshold value (e.g., "THRESHOLD"), and ("low interval") an interval including samples whose values are below a second predetermined threshold value (e.g., "−THRESHOLD"). The "unfiltered interval" can be omitted. Samples in the high end open interval and samples in the low end interval would fall into the respective/separate open intervals. Updating the correction terms based on the correlations would involve updating correction terms based on (1) correlations associated with an interval including samples whose values are above a first predetermined threshold value, and (2) correlations associated with an interval including samples whose values are below a second predetermined threshold value. To correct for the even-order distortions, e.g., second order distortions, the update loops from the separate sets of correlation results on the "high interval" and the "low interval" mentioned above, can estimate gain for the respective intervals. The gain estimated on one of the "high end interval" or the "low end interval" can serve as the reference gain. The update loop can drive, e.g., the second order static non-linearity correction term $\hat{b}_{k=2}[n]$ until the gain estimate for "low end interval" is equal to the gain estimated from the "high end interval". An exemplary update equation for the update loop can be as follows:

$$\hat{b}_{k=2}[n] = \qquad (9)$$

$$\hat{b}_{k=2}[n-1] - \mu \frac{1}{N} \sum_{l=0}^{N-1} [err_{high}[l] * PN_{high}[l] - err_{low}[l] * PN_{low}[l]]$$

err[l] is the error signal (e.g., the corrected residue with the 1-bit PN/RCAL signal removed, or yc[n]−PN[n]). In update equation (9), $err_{high}[l]$ is the error signal within the "high end interval". $err_{low}[l]$ is the error signal within the "low end interval". $err_{high}[l]*PN_{high}[l]$ and $err_{low}[l]*PN_{low}[l]$ are driven to be equal to each other. This update loop is illustrated as the "second-order correction loop" in FIG. 6B. As the update loop runs, and the system becomes more "equalized"; the correlations in the high end interval would be closer to the correlations in the low end interval. The update for the correction term would converge, as the update term, $$\frac{1}{N} \sum_{l=0}^{N-1} [err_{high}[l] * PN_{high}[l] - err_{low}[l] * PN_{low}[l]]$$

in equation (9), approaches 0.

Piecewise Calibration without Model Fitting

It is possible to divide up the signal range, e.g., the error signal, into more intervals, making no assumptions for model order. Such a scheme can better correct for, e.g., fourth order and fifth order distortions. In a piecewise fashion, one or more separate/parallel least means squared update loops can be run on different open intervals and piecewise linear correction can be applied to the closed intervals.

Figure 7A:
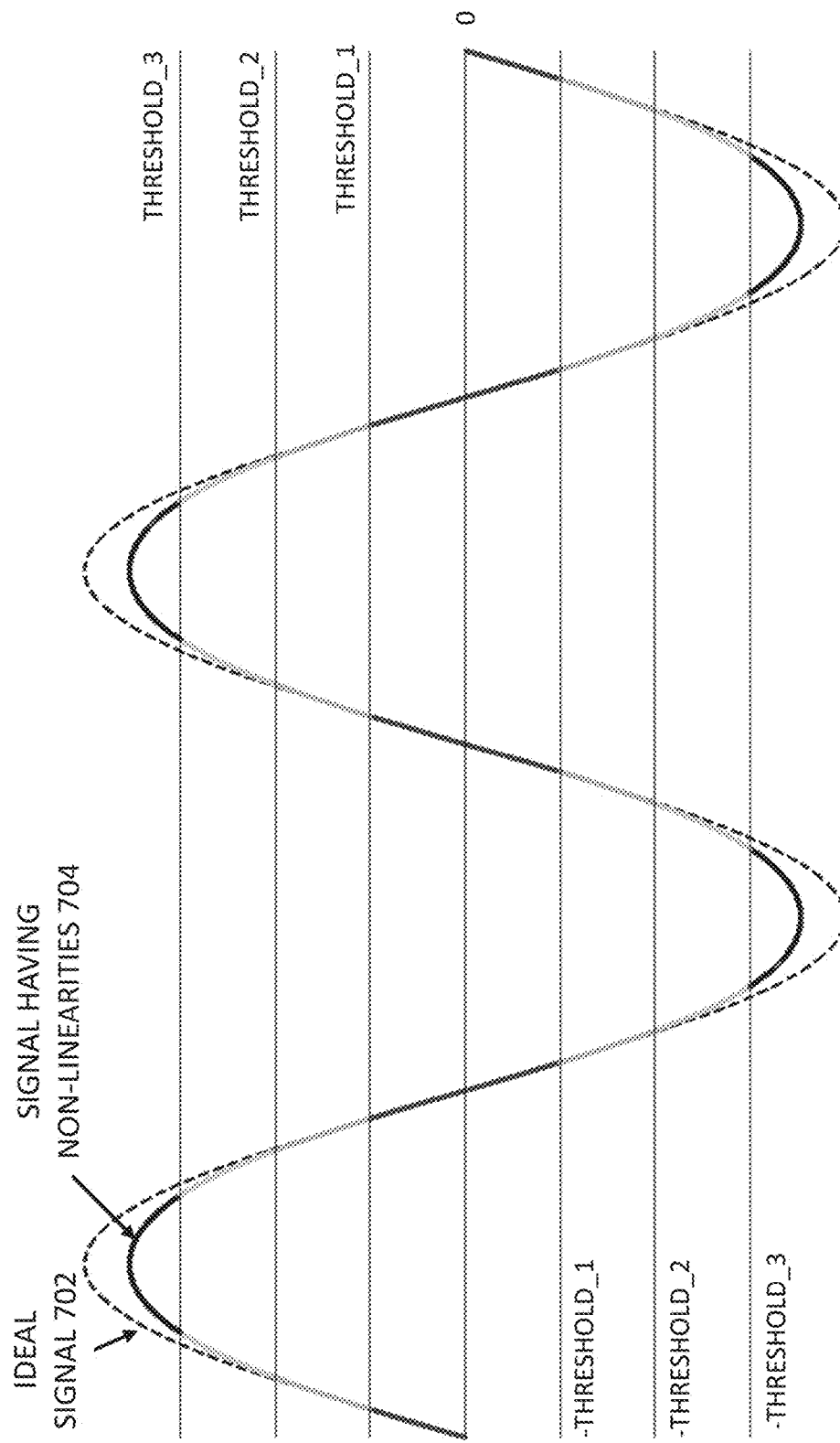
FIGS. 7A-B illustrate using a plurality of open intervals to determine piecewise linear correction terms, according to some embodiments of the disclosure.

FIG. 7A illustrates using a plurality of open intervals to determine piecewise linear correction terms, according to some embodiments of the disclosure. Similar to FIG. 6, ideal signal 702 (solid line) and the signal having non-idealities 704 (dotted line) are shown. In this example, the different open intervals comprises: a plurality of first intervals associated with different predetermined threshold values (e.g., 0, "THRESHOLD_1", "THRESHOLD_2", "THRESHOLD_3" in the example) each including samples (e.g., of the error signal) whose values are above a predetermined threshold value corresponding to a particular first interval, and a plurality of second intervals associated with different predetermined threshold values (e.g., 0, "−THRESHOLD_1", "−THRESHOLD_2", "−THRESHOLD_3" in the example)

each including samples (e.g., of the error signal) whose values are below a predetermined threshold values corresponding to a particular second interval.

The open intervals are provided to sort correlation results associated with samples of the error signal, e.g., err[n], falling within one or more open intervals. The intervals do not have to be evenly spaced across the range and any suitable number of intervals can be used. These parameters, i.e., the predetermined threshold values, can be adjusted based on the expected nonlinearity of the system and desired complexity of the calibration system. If even-order effects are negligible, the different open intervals comprises: an interval including all samples (e.g., of the error signal), and a plurality of intervals associated with different predetermined threshold values, each including samples (e.g., of the error signal) whose absolute value is above a predetermined threshold value corresponding to a particular one of the intervals.

Updating the correction terms based on the correlations would involve estimating piecewise linear correction terms based on the different open intervals. As explained previously and illustrated by FIG. 7B, the 1-bit PN/RCAL is subtracted from the corrected output, e.g., yc[n], to generate an error signal (yc[n]−PN[n]=err[n]). Threshold logic, e.g., open intervals is used to determine in which one or more open intervals the error signal err[n] falls. Logic can be applied to filter the correlation results based on the respective open intervals. An update loop can be run for each of the open intervals separately. Since the open intervals overlap, an open interval's update loop can not only update the gain correction term for its own open interval, the update loop can also update the gain correction for one or more intervals the open interval overlaps with. Viewed differently, as the outer open intervals fixes its gain (appears more linear), the next inner open interval would see a corrected outer open interval and fixes itself. Phrased differently, the outer intervals help the inner intervals converge. The result is a linear piecewise estimation of the non-linearity of the system, where non-linearities can be corrected with a linear correction. An exemplary update equation for an update loop is as follows:

$$\alpha[l:L;n+1]=\alpha[l:L;n]+\mu*\Sigma[(yc[n]-PN[n])*PN[n]] \quad (10)$$

In the equation (10), different correction terms are computed for L different open intervals. For instance, piecewise-linear correction terms can be computed separately for the L different open intervals. The error signal, i.e., (yc[n]−PN [n]), can be correlated with the 1-bit PN/RCAL signal. The correlation results can be filtered based on the L different open intervals. These update loops for the intervals can run in parallel.

Generally speaking, the inner open intervals (bigger) can collect more samples or correlation results than the outer open intervals (smaller). Once sufficient number of samples or correlation results have been collected and processed, digital circuitry can send an interrupt or any suitable signal to a state machine, digital processing circuitry, or an (on-chip) microprocessor, to compute correction terms. The state machine, digital processing circuitry, or microprocessor can write the correction terms to the circuitry so the correction terms can be applied for post-distortion.

Piecewise Correction and Offset to Avoid Discontinuities

With correction terms estimated from the open intervals, the calibration scheme then applies the correction terms separately for closed intervals corresponding to the open intervals. For examples, piecewise linear correction terms can be applied. The output signal of the circuit (i.e., the signal to be distorted), is divided into closed intervals, and corresponding correction term(s) are applied. For a residue producing circuit, the output signal of the signal would be the residue signal. As an example, the following open intervals set (11) (s[k] is a signal of interest):

$$s_{open}[z]:0<\mathrm{abs}(s[k])$$

$$s_{int1\_folded}[z]:\mathrm{int}[1]<\mathrm{abs}(s[k])$$

$$s_{int2\_folded}[z]:\mathrm{int}[2]<\mathrm{abs}(s[k]) \quad (11)$$

would correspond to the following closed intervals set (12) (respectively):

$$s_{closed}[z]:0<\mathrm{abs}(s[k])<\mathrm{int}[1]$$

$$s_{int1\_closed}[z]:\mathrm{int}[1]<\mathrm{abs}(s[k])<\mathrm{int}[2]$$

$$s_{int2\_closed}[z]:\mathrm{int}[2]<\mathrm{abs}(s[k])<\mathrm{int}[3] \quad (12)$$

Figure 8:
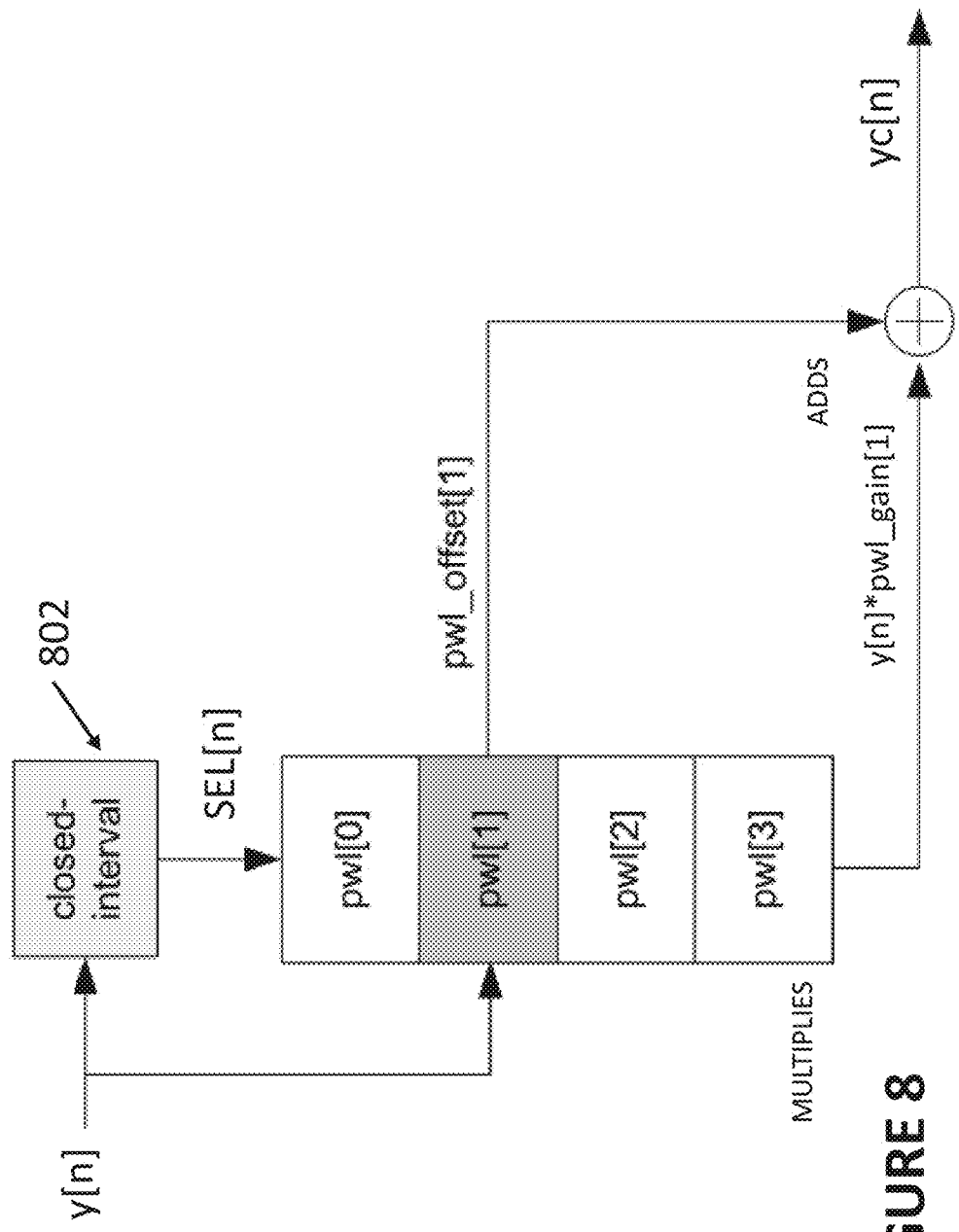
FIG. 8 illustrates an exemplary scheme for piecewise linear correction of static non-linearities, according to some embodiments of the disclosure.

These closed intervals seen in interval definitions set (12) no longer overlap, but uses the same interval threshold points as the detection path. FIG. 8 illustrates an exemplary scheme for piecewise linear correction of static non-linearities on closed intervals, according to some embodiments of the disclosure. The circuit takes in the output of the circuit, y[n], and generates a corrected output of the circuit yc[n]. Although not shown, the circuit can optionally remove a DC offset (if such an offset is present), prior to further post-distortion of the output signal. Subtracting the DC offset of residue can remove backend (i.e., the stage(s) digitizing the residue) offset errors. The circuit seen in FIG. 8 includes a closed interval sorting block 802 for determining in which one of closed intervals a sample of the output signal, e.g., (uncorrected) output signal y[n], or residue signal) falls, and outputting a selection signal ("SEL[n]") to select one or more correction terms for linearizing the circuit. The closed interval sorting block 802 segments the output signal y[n] (or the signal of interest) into closed-intervals.

The selection signal SEL[n] selects the correction terms which includes a gain coefficient pwl_gain[ ] and an offset pwl_offset[ ] for each open interval. Offsets can be included to avoid discontinuities when gain correction changes between intervals:

$$pwl\_\mathrm{offset}[l]=pwl\_\mathrm{offset}[l-1]+(\alpha[l-1]-\alpha[l])*\mathrm{int}(l);$$
$$pwl\_\mathrm{offset}[1]=0 \quad (13)$$

With equation (13) for computing offsets, any jump between intervals are avoided. Post-distortion thus includes multiplying the output signal to be corrected, y[n] with a selected multiplier pwl_gain[ ] to correct for the gain (arriving at y[n]*pwl_gain[sel[n]]), and adds a selected offset pwl_offset[ ] after the multiplication (arriving at yc[n]=y[n]*pwl_gain[SEL[n]]+pwl_offset[SEL[n]]). The correction piece would only require one multiplier and one adder, which makes for a simple digital correction scheme.

The corrected output of the circuit yc[n] is provided to circuitry for detecting errors using open intervals. Preferably, the previously injected 1-bit PN/RCAL signal is not subtracted until after the correction (or post-distortion is performed) and prior to correlations being performed for detecting errors, since 1-bit PN/RCAL signal is part of the signal that was amplified.

Figure 9:
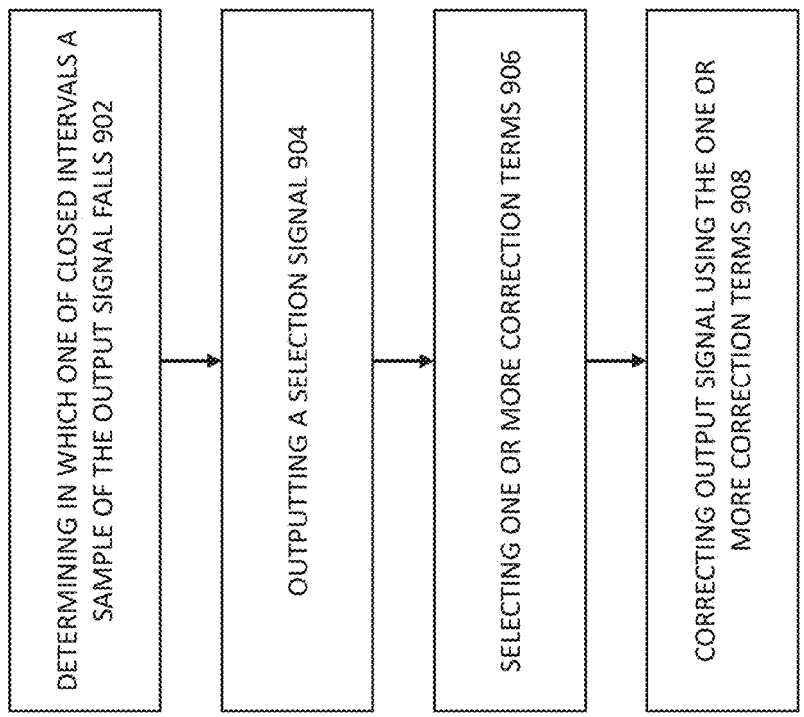
FIG. 9 is a flow diagram illustrating a method for piecewise linear correction of static non-linearities, according to some embodiments of the disclosure.

FIG. 9 is a flow diagram illustrating a method for piecewise linear correction of static non-linearities, according to some embodiments of the disclosure. In task 902, a closed interval sorting block can determine in which one of the closed intervals a sample of the output signal y[n] falls (e.g., determine in which closed interval the residue falls). In task 904, the closed interval sorting block outputs a selection signal. In task 906, the selection signal can select from one or more look up tables (or some suitable storage), one or more correction terms. The correction terms can include a multiplicative correction term and an additive correction term. In task 908, the one or more correction terms are used to correct the output signal y[n] to reduce the error of the system. The corrected output signal is yc[n].

PWL-FIR Filter Correction: Frequency/Memory-Dependent Errors

The previous examples are described in relation to static non-linearity, where the non-linearities are assumed to be dependent on the current sample of the signal of interest. In some cases, (linear and non-linear) errors can depend on leading or lagging samples. The previous examples can be extended to correct for such frequency/memory-dependent errors and Hammerstein-style terms, e.g., x[n−1], $x^3$[n−1], $x^2$[n+1], etc. FIGS. 10A-D illustrate extending the open interval method being extended to estimate and correct for linear/non-linear frequency/memory-dependent errors. Performing correlations comprises correlating the error signal with a lagging or leading sample of the pseudo-random signal for at least one of the open intervals of the error signal. One example update equation for the update loops for L different open intervals (without model fitting) can be as follows:

$$\propto[k;l:L;n+1] = \propto[k;l:L;n] + \mu^* \Sigma[(yc[n]-PN[n])^*PN[n-k]] \quad (14)$$

Figure 10A:
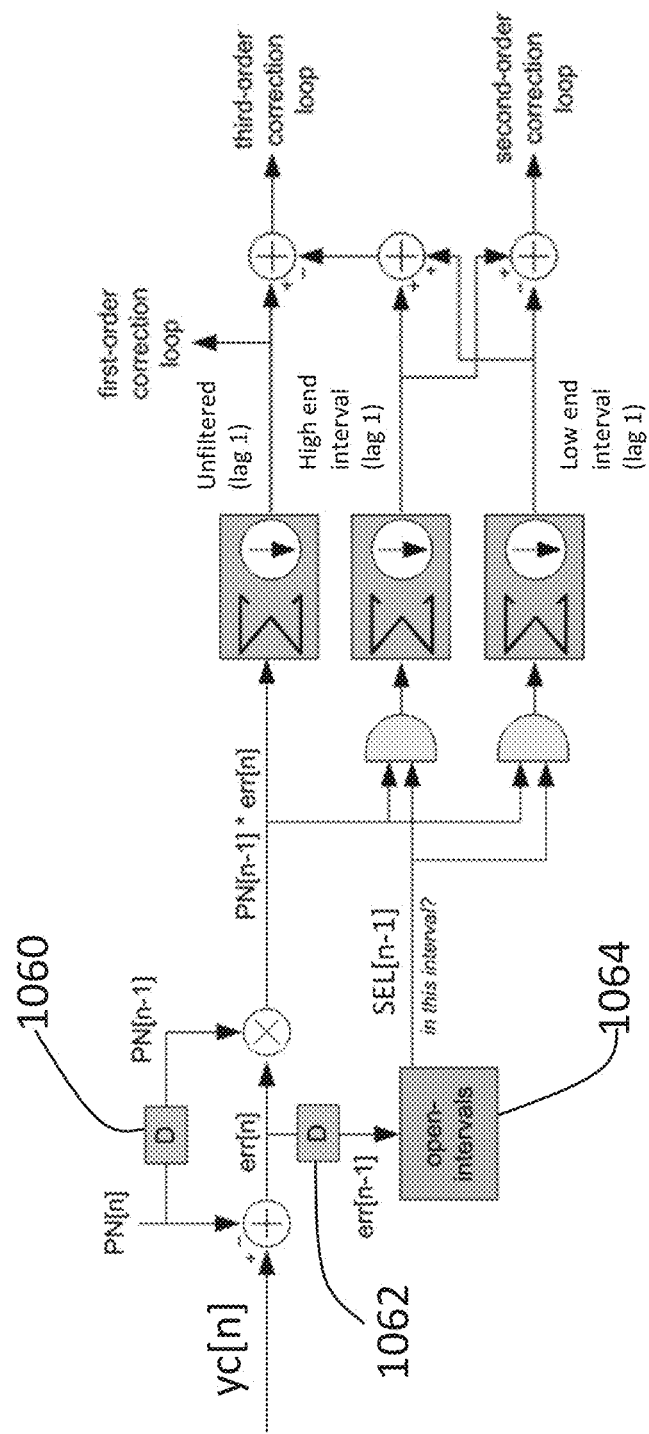
FIGS. 10A-D illustrate an exemplary scheme for detecting errors and performing piecewise linear correction of frequency/memory dependent errors, according to some embodiments of the disclosure.
Figure 10B:
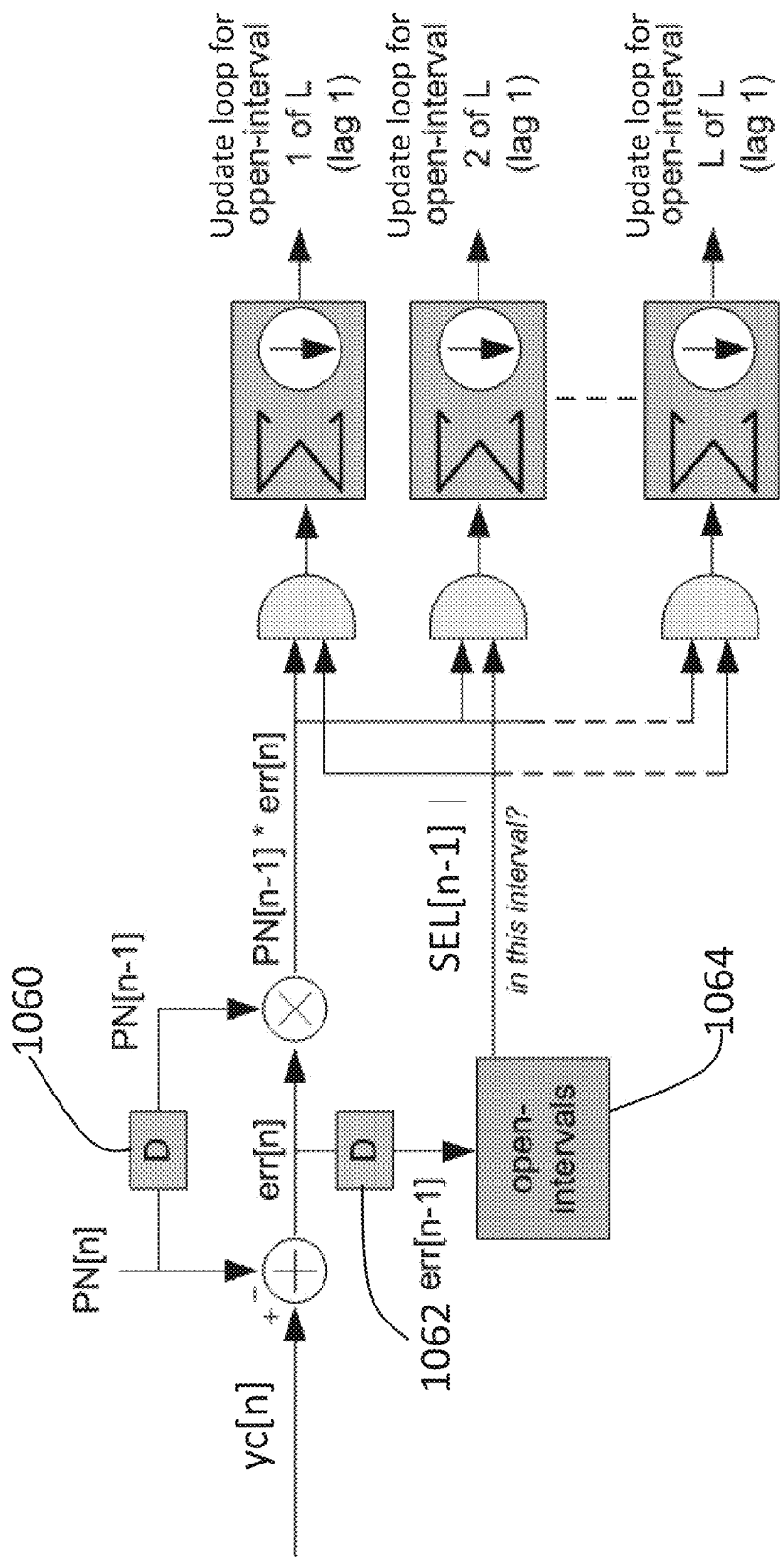

The correlations differ from the static non-linear gain calibration because the error signal (err[n]=yc[n]−PN[n]) is being correlated with a leading or lagging sample of the 1-bit PN/RCAL signal, PN[n−k]. The open intervals would be applied to a leading or lagging sample of the error signal, err[n−k] of the same lag k. In other words, the different open intervals can include one or more open intervals defined based on an amplitude of a leading or lagging sample of the error signal. A leading or lagging sample of 1-bit PN/RCAL signal PN[n−k] is correlated with the error signal (obtaining PN[n−k]*err[n]). The error signal having a lag of k (err[n−k]) is used for sorting correlation results into different open intervals, and one or more update loops can be run based on the sorted correlation results. The one or more update loops can be used to update correction terms, and the correction terms can be applied to closed intervals of the output signal having a lag of k, y[n−K]. FIGS. 10A-B shows examples for dealing with error terms of lag k=1.

Figure 7B:
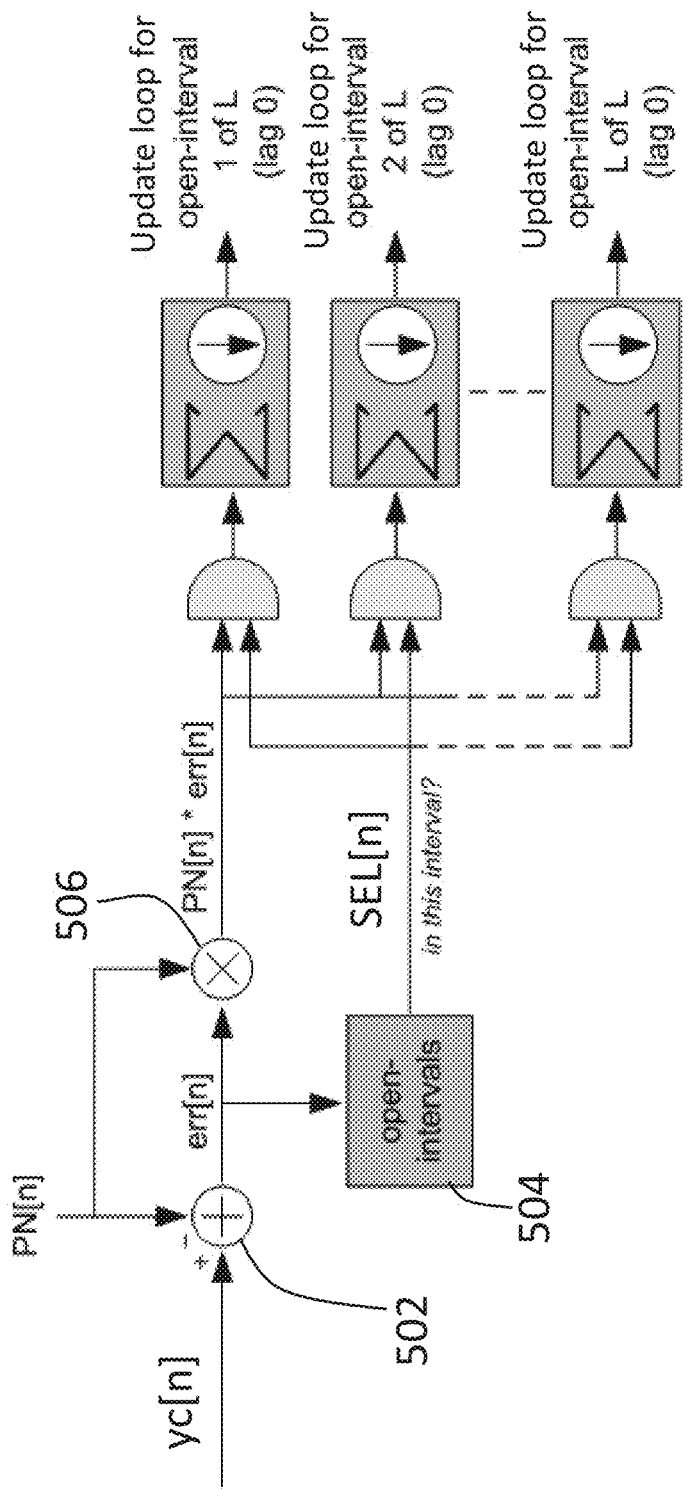

As seen in FIGS. 10A-B, the schemes shown in FIGS. 6B and 7B are extended to include delay block 1060 to delay the 1-bit PN/RCAL signal to obtain PN[n−1], for an example where lag k=1. The error signal, err[n] is correlated with the delayed 1-bit PN/RCAL signal, i.e., PN[n−1]*err[n]. The delayed error signal, err[n−1], is provided as input to the threshold logic (open-intervals block 1064) to generate a selection signal for sorting the correlation results. The examples illustrated by FIGS. 10A-B, can be extended to account for a lag of k.

Referring to FIG. 10A, the gain estimate based on unfiltered set of correlations PN[n−1]*err[n] can estimate the gain error associated with x[n−1]. The gain estimate based on correlations PN[n−1]*err[n] from the high-low end interval (combined high end interval and low end interval) can be driven to match the gain estimate based on correlations from unfiltered interval to correct the gain error associated odd-order distortions associated with x[n−1], e.g., $x^3$[n−1]. The gain estimate based on correlations PN[n−1]*err[n] from the high end interval can be driven to match the gain estimate based on correlations PN[n−1]*err[n] from the high end interval to correct the gain error associated even-order distortions associated with x[n−1], e.g., $x^2$[n−1]. The open intervals are based on the error signal having the same lag, in this case, err[n−1], which is generated by delay block 1062.

Referring to FIG. 10B, the gain estimate based on each set of correlations PN[n−1]*err[n] accumulated for the L intervals can estimate the gain errors associated with x[n−1]. The open intervals are based on the error signal having the same lag, in this case, err[n−1], which is generated by delay block 1062.

Figure 10C:
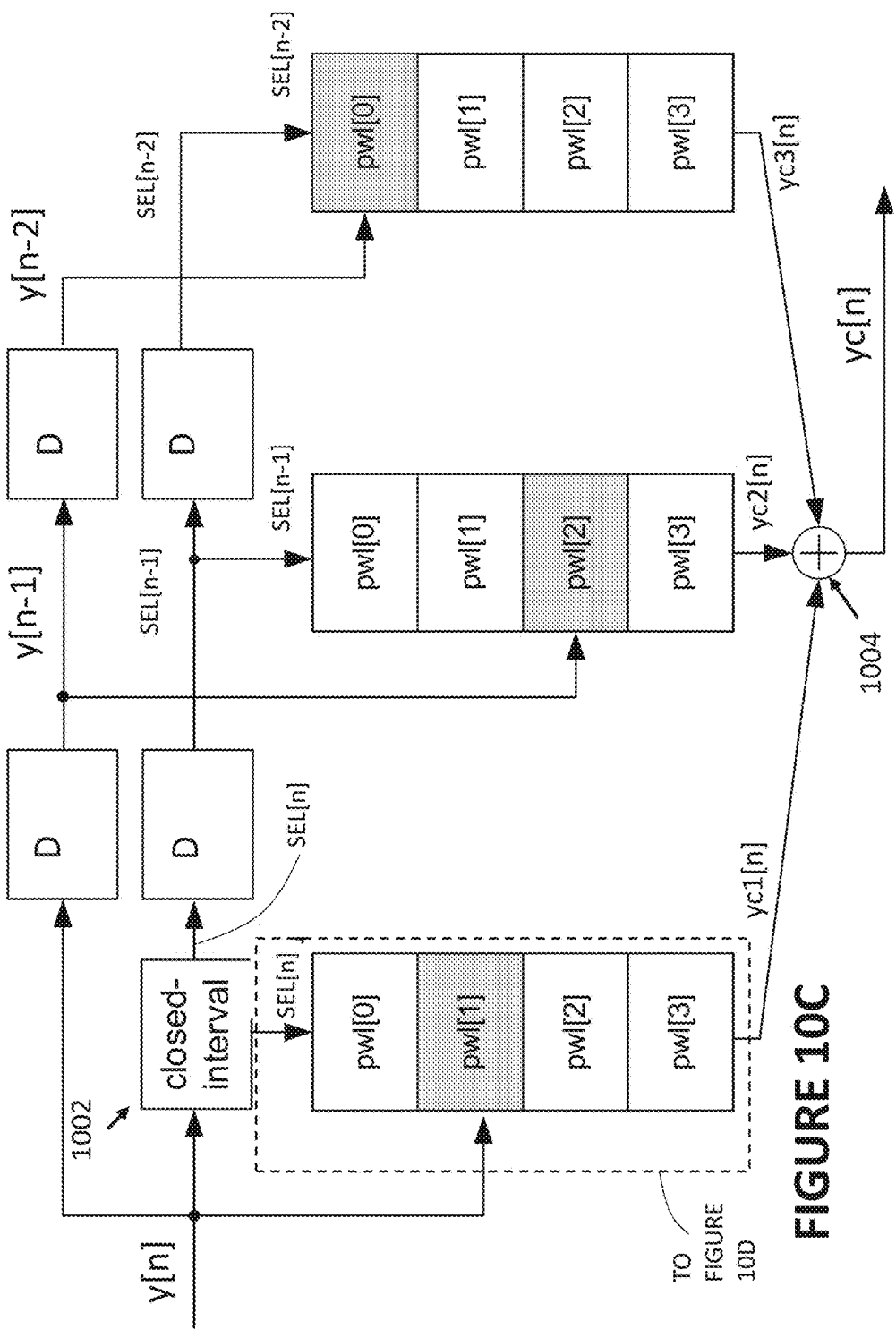
Figure 10D:
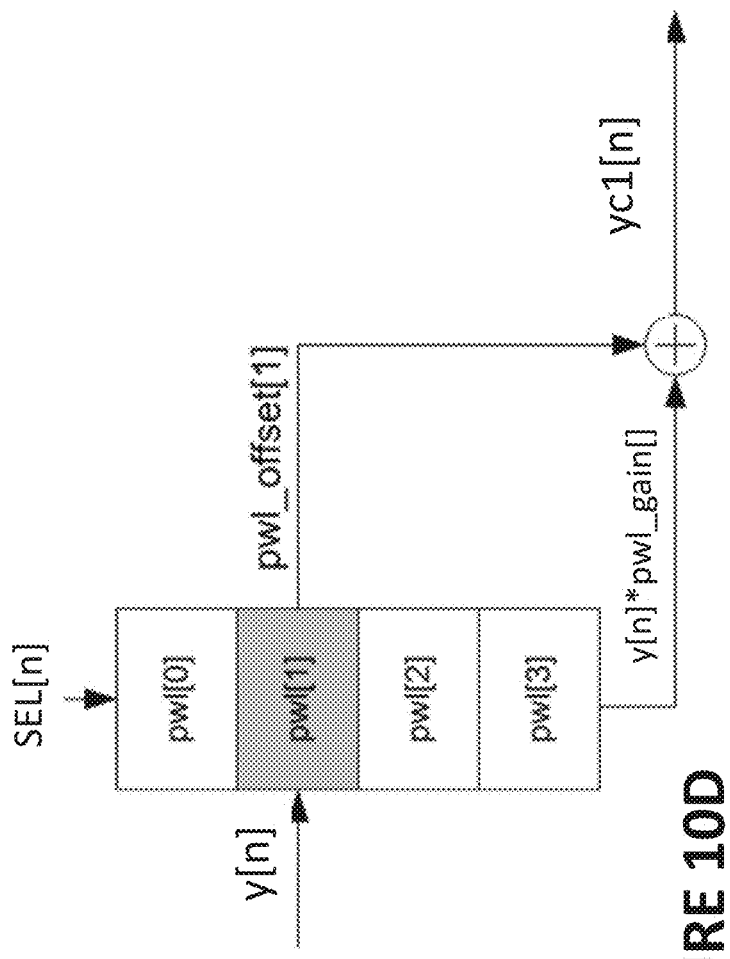

FIGS. 10C-D illustrates an exemplary scheme for piecewise linear correction of frequency/memory dependent errors, according to some embodiments of the disclosure. Generally speaking, a circuit can include a number of taps corresponding to different time instants (various values of lag k, where k can be positive or negative). For simplicity, this correction circuit includes three taps (similar to taps of a finite impulse response filter, but different since the logic is more complex than a finite impulse response filter). One tap is of zero lag k=0, another tap is of lag k=1, and yet another tap is of lag k=2. The same structure can be provided for other numbers of taps or taps associated with a different value for k.

The circuit includes a closed interval sorting block 1002 for determining in which one of closed intervals a sample of the output signal y[n] (e.g., the residue, for a residue producing circuit, or an uncorrected output of a circuit to be corrected) falls, outputting a selection signal (e.g., "SEL[n]"). The selection signal selects one or more correction terms based on the closed interval. "D" represents delay blocks for delaying an input signal such as y[n] and generating a time-delayed output signal such as y[n−1]. The closed interval selection is piped along with the residue data to select a unique interval at each delay tap t of T total taps (T=3 in the example shown). The interval selection for each tap (i.e., SEL[n−k]) is used for selecting correction term(s) to be applied to the corresponding output sample going into the tap, i.e., y[n−k], (the interval selection and the output sample are time-aligned). At each tap, a unique piecewise linear function is applied to correct the signal. For simplicity, only a multiplicative correction term is shown in FIG. 10C, but other look up tables (or data structures) can be included for selecting the additive correction term to correct the offset as well (as illustrated by FIG. 10D). As illustrated by the example in FIG. 10A, the selection signal (e.g., "SEL[n])") and one or more delayed versions of the selection signal ("SEL[n−1], SEL[n−1]") each selects one or more correction terms for producing an intermediate value, e.g., yc1[n], yc2[n], and yc3[n], based on a time-aligned output sample, e.g., y[n], y[n−1], y[n−3] respectively. The circuit further includes a combination block 1004 for combining the intermediate values for linearizing the circuit (i.e., results from the correction performed by the different taps can be summed) to generate the final corrected output signal yc[n]. The result is a calibration scheme which can account for frequency/memory dependent errors and Hammerstein-style terms (no cross terms). The number of taps can be chosen depending on the degree of frequency/memory effects.

Figure 11:
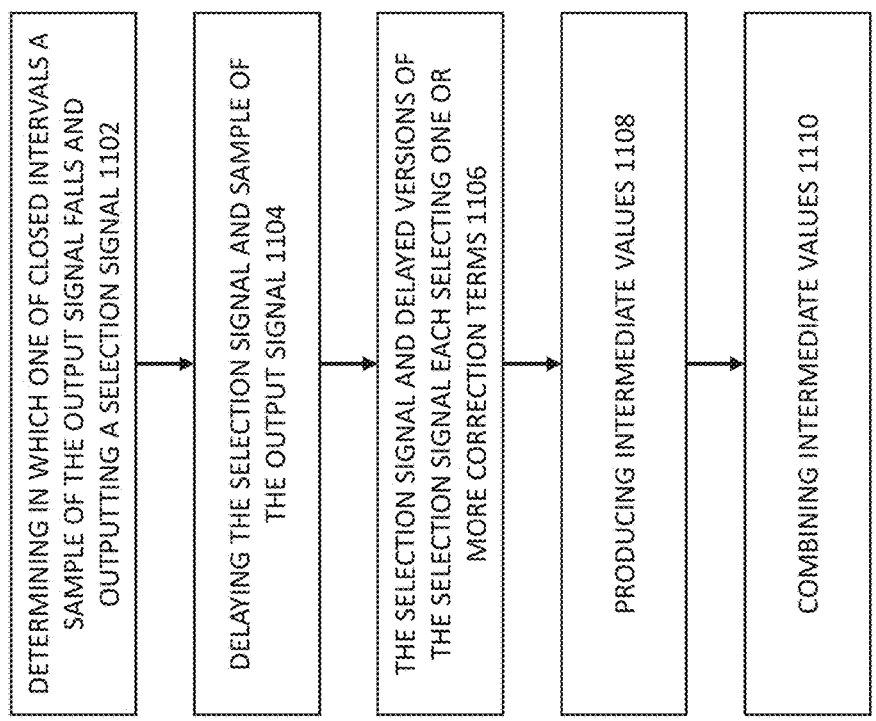
FIG. 11 is a flow diagram illustrating a method for piecewise linear correction of frequency/memory dependent errors, according to some embodiments of the disclosure.

FIG. 11 is a flow diagram illustrating a method for piecewise linear correction of frequency/memory dependent errors, according to some embodiments of the disclosure. In task 1102, a closed interval sorting block 1002 determines in which one of the closed intervals a sample of the output signal (e.g., y[n], the residue or some signal of interest) falls, and the closed interval sorting block 1104 outputs a selection signal, and delay blocks delay the selection signal. In task 1104, delay blocks delay the sample of the output signal and the selection signal. In task 1106, the selection signal and delayed versions of the selection signal each selects one or more correction terms (each tap having respective unique correction term(s)). In task 1108, intermediate values are produced, by applying the selected correction terms for different taps (from task 1106) to the sample of the output signal and delayed versions of the output signal respectively. In task 1109, the intermediate values are combined to generate the final corrected output signal.

One skilled in the art would appreciate that the structure of the taps and delays would be implemented differently depending whether the model requires leading and/or lagging samples, and the numbers of taps desired.

Dealing with Cross-Terms

Extracting the error information associated with cross terms is not trivial. Examples of Wiener-type cross terms are as follows:

$$C^*x^2[n]^*x[n-1]$$
$$C^*x^2[n-1]^*x[n]$$
$$C^*x^2[n]^*x[n-2]$$
$$C^*x^2[n-2]^*x[n]$$
$$C^*x^2[n-1]^*x[n-2]$$
$$C^*x^2[n-2]^*x[n-1]$$
$$C^*x[n]^*x[n-1]^*x[n-2] \quad (15)$$

To extract Wiener-type cross terms (seen in expressions set (15)), performing correlations can include correlating the error signal with a product of samples of the pseudo-random signal at different time instants. Correlating with a product of samples of the pseudo-random signal allows for gain deviations to be detected for cross terms. For instance, information associated with cross terms having $x[n]$ and $x[n-1]$, e.g., $x^a[n]x^d[n-1]$, can be extracted by correlating with $PN[n]^*PN[n-1]$. Furthermore, depending on the cross term of interest, the different open intervals of the error signal can include an open interval based on the error signal, a leading or lagging sample of the error signal, or a product of samples of the error signal at different time instants. For instance, the open interval for sorting correlations of $PN[n]^*PN[n-1]^*err[n]$ can be defined based on $err[n]^*err[n-1]$. Depending on the higher order term or cross term of interest, the correction may be applied to different closed intervals of a sample of the output signal, a leading or lagging sample of the output signal, or a product of samples of the output signal at different time instants. For instance, the closed interval can be defined based on $y[n]^*y[n-1]$.

Broadly speaking, to extract error for cross terms, the error signal $err[n]$ can be correlated with a product of two or more samples of the 1-bit PN/RCAL signal at different time instants (e.g., to estimate second or higher order terms). To better understand the error detection and calibration schemes mentioned above, FIGS. 12-17 illustrate various schemes extending the open interval method to estimate and correct for cross terms.

Note that the examples dealing with cross terms can be used with model fitting or without model fitting. The example shown in FIGS. 12A-B and 13 has model fitting (uses unfiltered, low end interval, and high end interval), whereas the example shown in FIGS. 14A-C and 15 does not require model fitting (e.g., uses a number of intervals). The correlations can be binned based on the error signal (as in FIG. 12A), or a product of samples of the error signal at different time instants (as in FIG. 14A), depending on the implementation. The correction terms can be applied to an output sample, or a product of the output samples at different time instants. An exemplary update equation (16) for the update loops corresponding to the different open intervals can be as follows:

$$\propto[k;l:L;n+1]=\propto[k;l:L;n]+\mu^*\Sigma[(yc[n]-PN[n])^* \\ (PN[n]^*PN[n-k])] \quad (16)$$

Figure 12A:
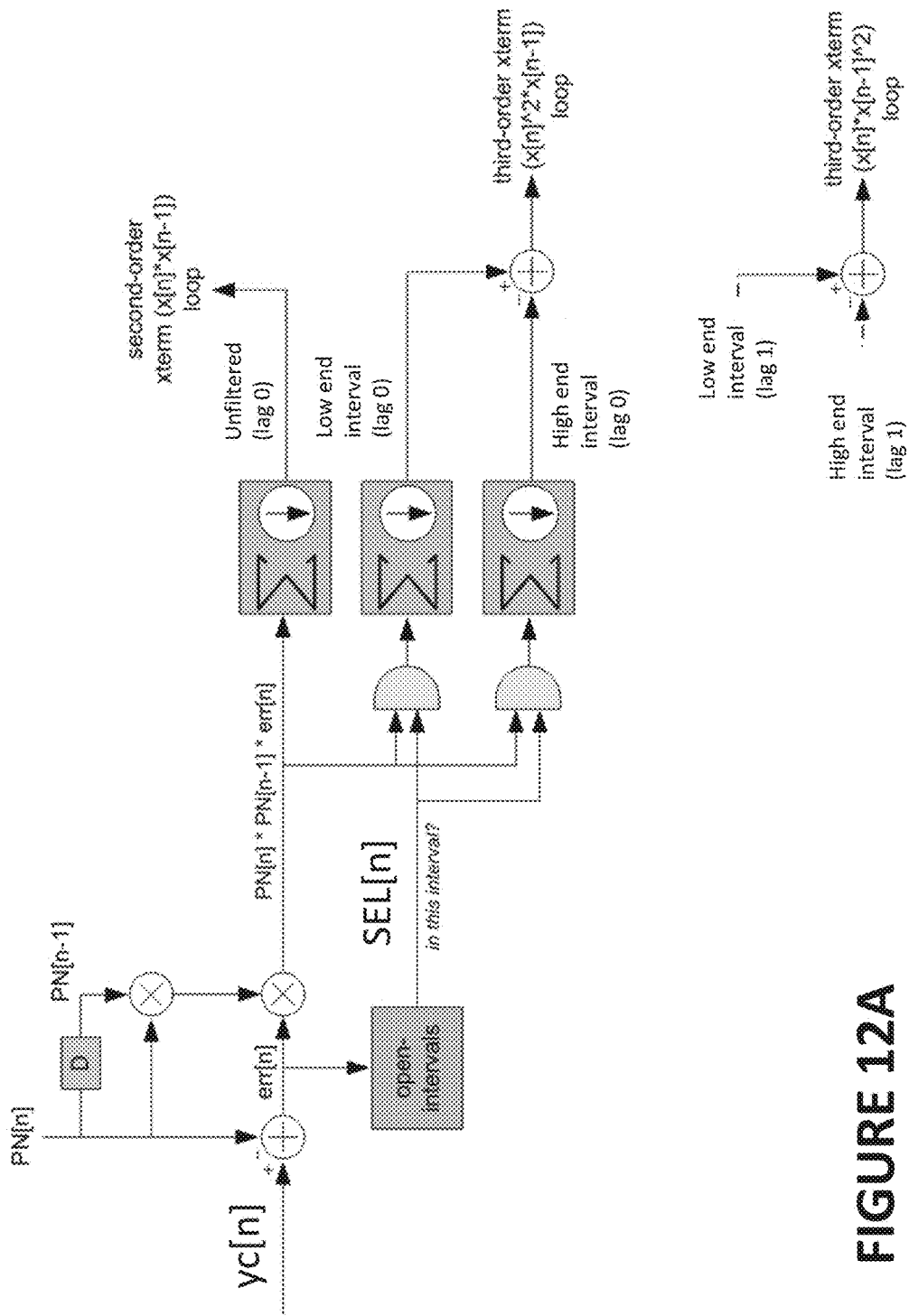
FIG. 12A illustrate an exemplary scheme for detecting errors using open intervals, according to some embodiments of the disclosure.
Figure 12B:
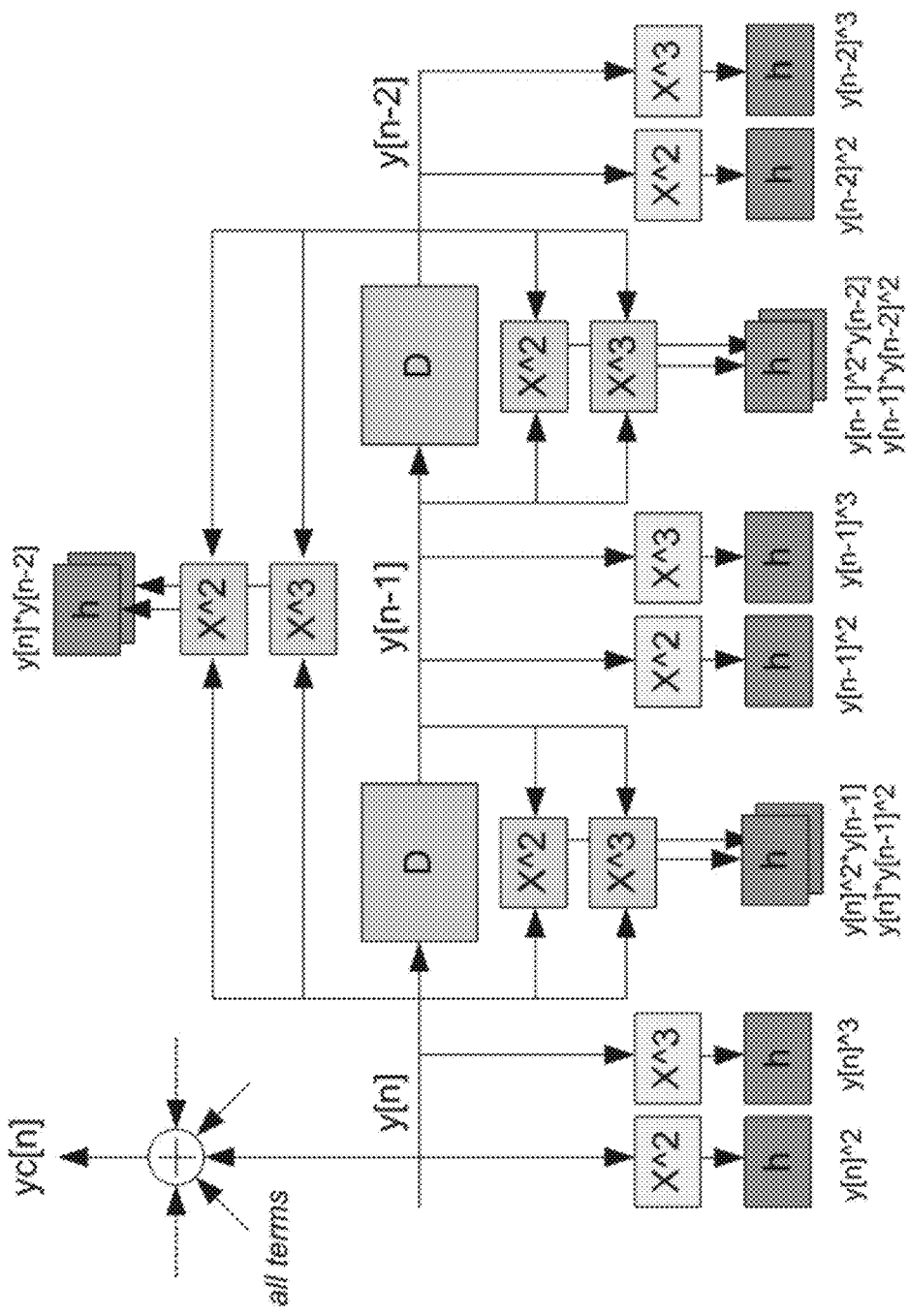
FIG. 12B illustrates an exemplary scheme for performing piecewise linear correction, according to some embodiments of the disclosure.
Figure 13:
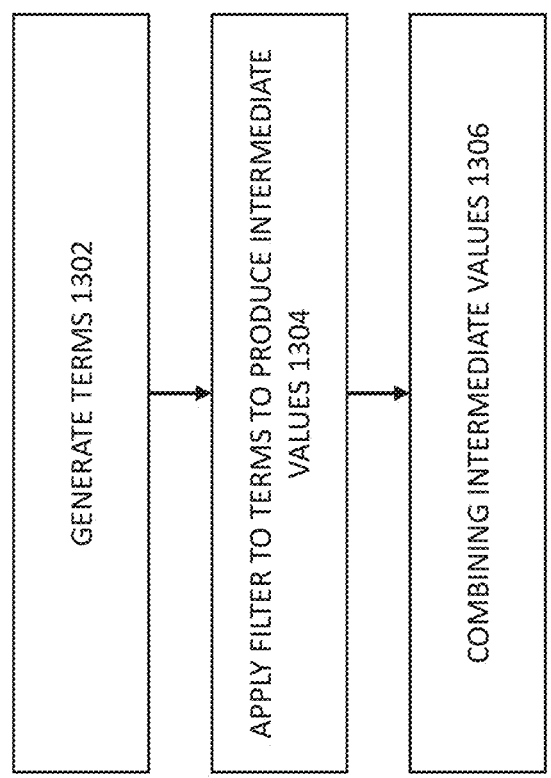
FIG. 13 is a flow diagram illustrating the method performed by the scheme in FIG. 12B, according to some embodiments of the disclosure.

FIGS. 12A-B and 13 illustrate an exemplary scheme for detecting errors using open intervals and performing piecewise linear correction, according to some embodiments of the disclosure. Specifically, this example applied the model fitting scheme for detecting errors, where the open intervals include an unfiltered interval, a low end interval, and a high end interval (extending the examples seen in FIGS. 6B and 10A). The errors which can be detected from the exemplary scheme in FIG. 12A are associated with cross terms having different lags, such as 0 and 1, $x[n]^*x[n-1]$, $x^2[n]^*x[n-1]$, $x[n]^*x^2[n-1]$.

Referring specifically to FIG. 12A, the error signal $err[n] = yc[n]-PN[n]$ is correlated with $PN[n]^*PN[n-1]$. By correlating the error signal $err[n]$ with $PN[n]^*PN[n-1]$ for the unfiltered interval, a second order "base" error term for $x[n]x[n-1]$ can be estimated. Other higher order terms involving both $x[n]$ and $x[n-1]$, e.g., $x^2[n]x[n-1]$, $x[n]x^2[n-1]$, can be derived using the end intervals and this second order "base" term.

For $x[n]^*x[n-1]$ cross term (second-order), samples of the error signal $err[n]=yc[n]-PN[n]$ can be correlated with $PN[n]^*PN[n-1]$. Correlation results are collected for all samples of $err[n]$ (i.e., unfiltered interval).

For $x[n]^*x^2[n-1]$ cross term (third-order), the error signal $err[n]=yc[n]-PN[n]$ is correlated with $PN[n]^*PN[n-1]$, and the correlation results can be filtered (i.e., sorted into open intervals) based on the error signal $err[n-1]$.

For $x^2[n]^*x[n-1]$ cross term (third-order), the error signal $err[n]=yc[n]-PN[n]$ is correlated with $PN[n]^*PN[n-1]$, and the error signal or the correlation results can be filtered (i.e., sorted into open intervals) based on the amplitude of the error signal $err[n]$.

FIG. 12B illustrate a scheme for correcting the output signal based on the model fitting calibration scheme, according to some embodiments of the disclosure. The scheme illustrated can correct for a variety of terms, including both non-cross terms (determined using the scheme illustrated by FIGS. 6B and 10A) and cross-terms (determined using the scheme illustrated by FIG. 12A). To perform a correction, a sample of the uncorrected output signal $y[n]$ can be delayed as needed to get $y[n-1]$, $y[n-2]$, etc. Using multipliers, the higher order terms, e.g., second- and third-order products of the output signal and any delayed samples, can be generated. "Like" terms such as $y^2[n]$ and $y^3[n-1]$ are "non-cross term", i.e., Hammerstein style terms. "Cross terms" such as $y[n]^*y[n-1]$ or $y2[n-1]^*y[n-2]$ are Wiener style cross terms. Each term is processed by a correction filter weight "h" (which could also include weights for linear terms which are not shown). The correction filter weight "h" can be computed by the model fitting detection scheme illustrated by FIGS. 6B, 10A, and 12A. Sum all of these results would yield the corrected signal $yc[n]$ correcting uncorrected signal $y[n]$. An exemplary equation for such correction scheme, with two taps, is, $yc[n]=y[n]+a0^*y^2[n]+a1^*y^2[n-1]+b0^*y^3$ $[n]+b1*y^3[n-1]+c0*y[n]*y[n-1]+d0*y^2[n]*y[n-1]+d1*y[n]*y^2[n-1]$, where a0, b0, b1, c0, d0, d1 are the correction filter weights of filter "h".

FIG. 13 is a flow diagram illustrating a method for piecewise linear correction of non-idealities, according to some embodiments of the disclosure. The method corresponds to the scheme illustrated in FIG. 12A-B. In task 1302, using delay blocks and multipliers, non-cross terms (e.g., $y^2[n]$ and $y^3[n-1]$) and cross terms (e.g., $y[n]*y[n-1]$ or $y^2[n-1]*y[n-2]$) are generated. In task 1304, a filter, e.g., "h", computed using the model fitting detection scheme by FIGS. 6B, 10A, and 12A is applied to various terms to produce intermediate values. In task 1306, the intermediate terms are combined, e.g., summed, to generate the final corrected output yc[n].

FIGS. 14A-C and 15 illustrate another exemplary scheme for detecting errors using open intervals and performing piecewise linear correction, according to some embodiments of the disclosure. Specifically, FIGS. 14A-C and 15 illustrate detecting errors based on open intervals, where the errors are associated with cross terms having different lags, such as 0 and 1, $x[n]*x[n-1]$, $x^2[n]*x[n-1]$, $x[n]*x^2[n-1]$. This scheme utilizes a number (L) of open intervals, and does not have to assume a particular model (extending the example seen in FIGS. 7B and 10B).

Figure 14A:
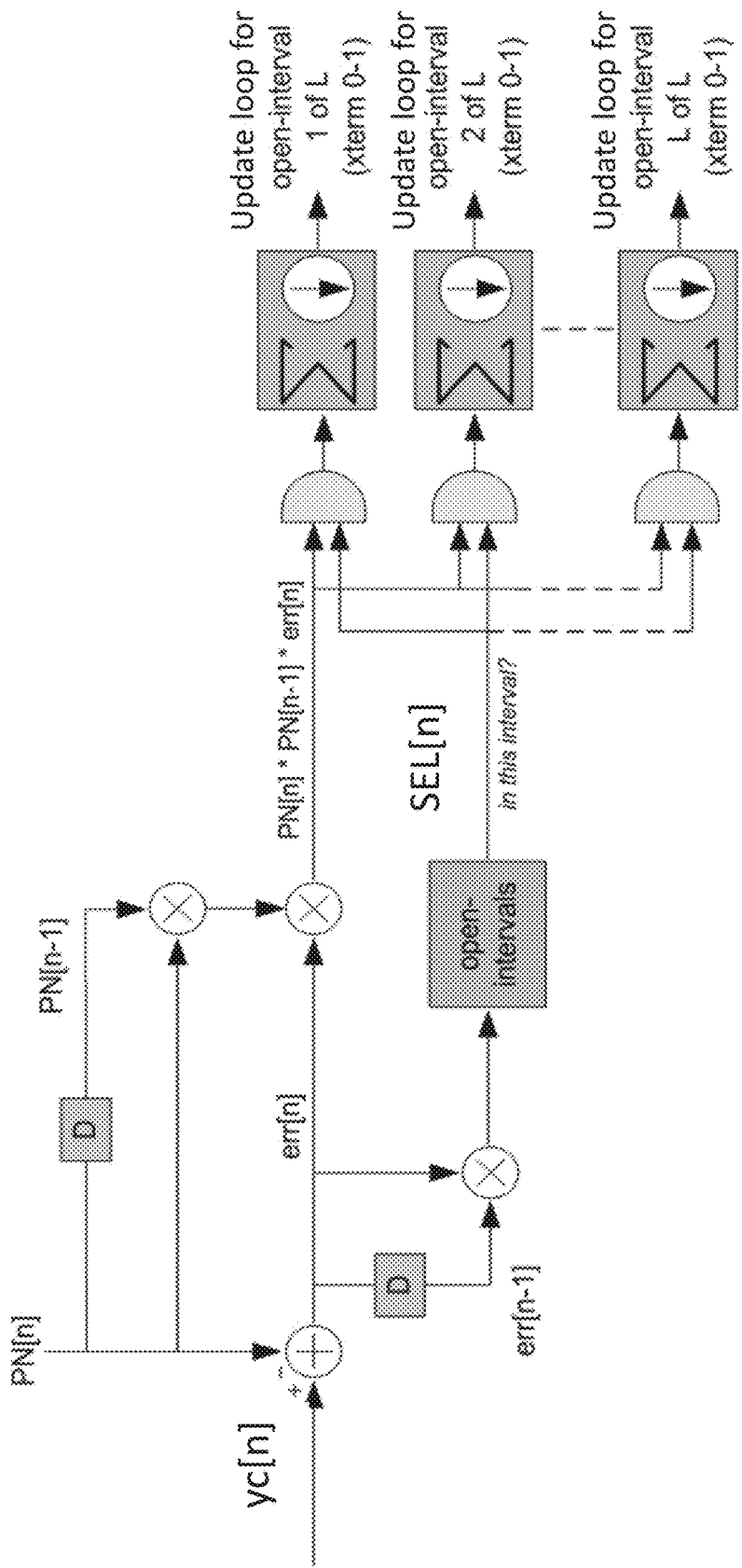
FIG. 14A illustrates an exemplary scheme for detecting errors using open intervals, according to some embodiments of the disclosure.

Referring specifically to FIG. 14A, the error signal err[n]=yc[n]−PN[n] is correlated with PN[n]*PN[n−1], and the correlation results can be filtered (i.e., sorted into open intervals) based on the product of the error signal at two different time instants err[n]*err[n−1]. Correction can be applied to samples of the output signal at different time instants. In this example, the correction would be applied to y[n]*y[n−1] directly, based on closed intervals defined for y[n]*y[n−1], as seen in FIG. 14B-C.

Figure 14B:
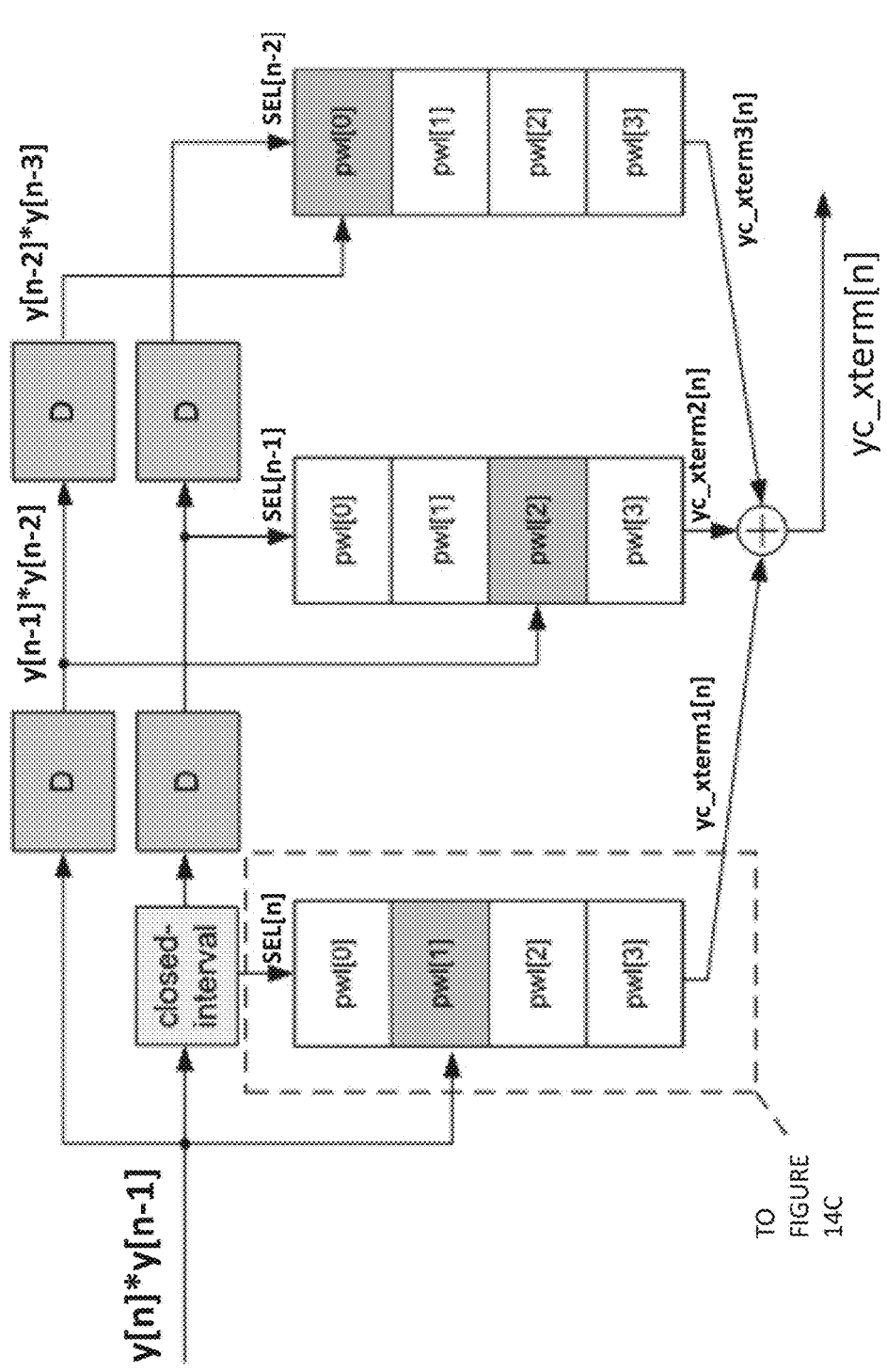
FIG. 14B-C illustrates an exemplary scheme for performing piecewise linear correction, according to some embodiments of the disclosure.
Figure 14C:
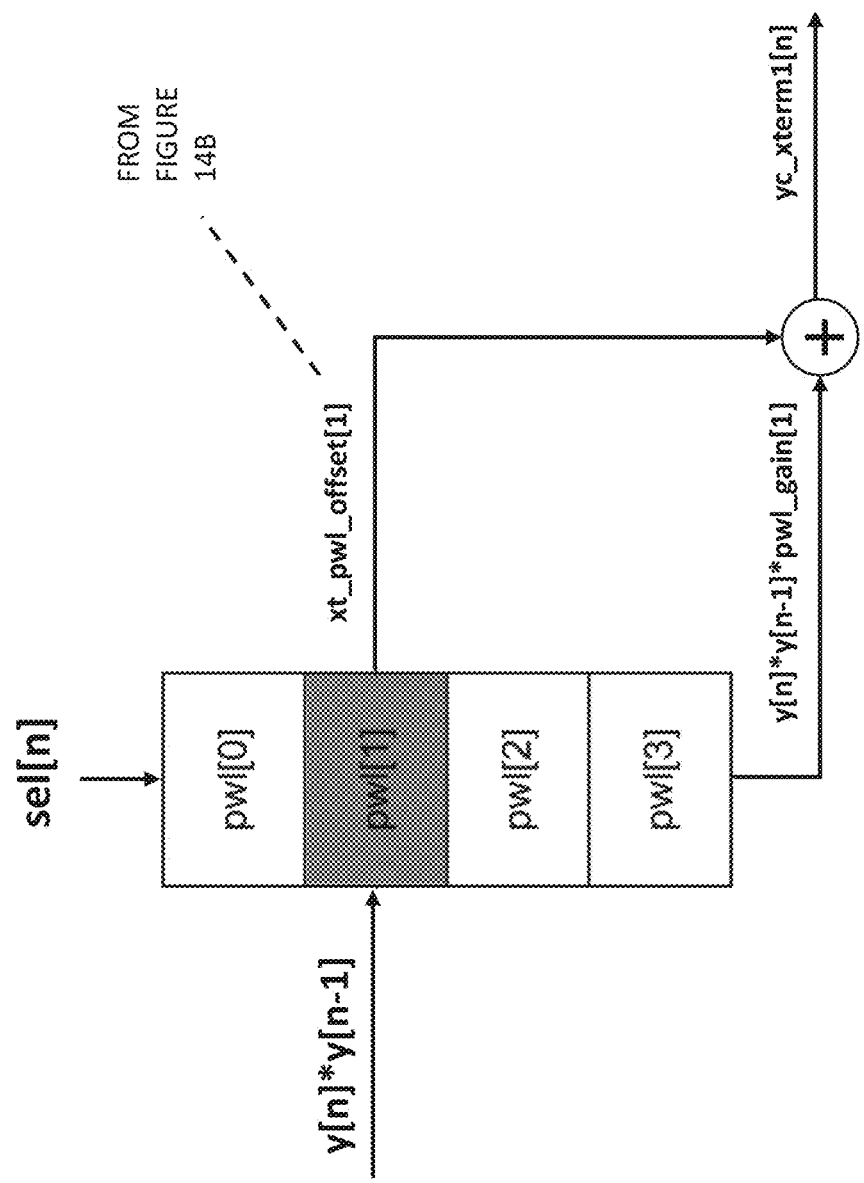

FIGS. 14B-C illustrate exemplary schemes for piecewise linear correction of cross terms, according to some embodiments of the disclosure. Specifically, FIG. 14A-B shows an example of applying correction to y[n]*y[n−1], using a three-tap approach, where the closed intervals are based on y[n]*y[n−1] (and delayed versions thereof). The amplitude of a product of the output signal at different time instants, e.g., y[n]*y[n−1] (and delayed versions thereof) as seen in this example, would be used to select a closed interval for each tap (e.g., by means of SEL[n], SEL[n−1], and SEL[n−2], etc.). The closed interval selected for each tap determines the corresponding correction term(s) to be applied for the tap. For each tap, correction term(s) would be applied to y[n]*y[n−1] (and delayed versions thereof). To avoid discontinuities as the correction terms changes across closed intervals of y[n]*y[n−1], a multiplicative gain term and an additive offset term can be applied to y[n]*y[n−1] to provide a continuous function for a particular tap, as illustrated by FIG. 14C. Intermediate values are produced for each tap, yc_xterm1[n], yc_xterm2[n], yc_xterm3[n], etc. The intermediate values are summed to generate the final corrected output yc_xterm[n].

Figure 15:
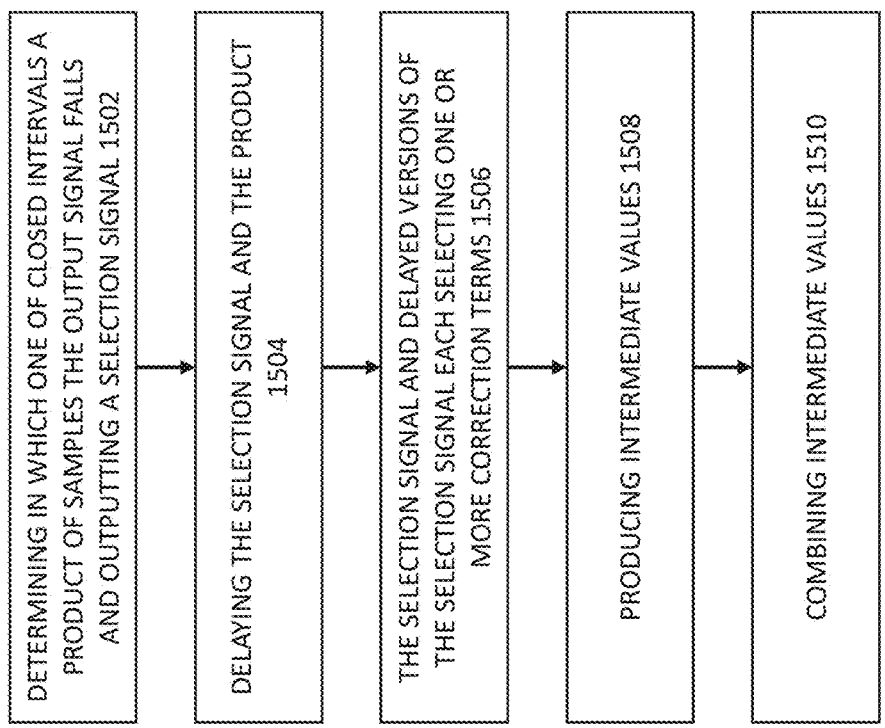
FIG. 15 is a flow diagram illustrating the method performed by the exemplary scheme shown in FIG. 14-B, according to some embodiments of the disclosure.

FIG. 15 is a flow diagram illustrating a method for piecewise linear correction of cross-terms, according to some embodiments of the disclosure. The method corresponds to the scheme illustrated in FIG. 14B-C. In task 1502, a closed interval sorting block can determine in which one of the closed intervals a product of the output signal at different time instants falls, and output a selection signal, i.e., based on the amplitude or magnitude of the product. In task 1504, delay blocks can be used to delay the selection signal and the product to obtain delayed versions of said signal such as SEL[n−2], SEL[n−1], SEL[n+1], SEL[n+2], etc., and y[n−1]*y[n−2], y[n−2]*y[n−3], etc. In task 1506, the selection signal and delayed versions of the selection signal each selects a multiplicative correction term and an offset correction term (corresponding to each "tap" seen in FIG. 14B). In task 1508, the product, or delayed versions of the product is multiplied by the multiplicative correction term (selected for that tap), and the offset correction term (selected for that tap) is added to the result of the multiplication. Intermediate values (e.g., yc_xterm1[n], yc_xterm2[n], yc_xterm3[n] seen in FIG. 14B) are produced by the taps. In task 1510, the intermediate values are combined to obtain the final corrected output signal (e.g., yc_xterm[n] seen in FIG. 14B).

Alternative Approach to Dealing with Cross Terms

In some embodiments, an approach different from the one illustrated in FIG. 14A can be used to deal with cross terms. Consider the following static non-linearity, the transfer function can be described as:

$$y[n]=x[n]*(\alpha+\beta x^2[n]) \quad (17)$$

In equation (17), the gain y[n]/x[n] is thus some constant α plus some dependency on the magnitude of the sample βx²[n]. The gain of the system varies with the current magnitude of the input to the system. For a cross-term (ignoring other terms), the transfer function can be described as:

$$y[n]=x[n]*(\alpha+\gamma x^2[n-1]) \quad (18)$$

In equation (18), it can be seen that the gain of the sample at time n depends on some constant α plus some dependency on the magnitude of the sample at time n−1, i.e., γx²[n−1]. The gain of the system at time n varies with the magnitude of the input to the system at other times, e.g., n−1, n−2, etc. The gain errors would come from lagging or leading samples.

For detection of the x[n]*βx²[n] term, it is possible to correlate to PN[n] while binning according to err[n] with open-intervals. The x[n]*γx²[n−1] can be handled similarly, with the difference that the intervals are applied according to the amplitude or magnitude of the lagging sample err[n−1]. More broadly, depending on the cross-term, the open intervals can be applied to the amplitude or magnitude of a leading sample or a lagging sample, e.g., err[n−k], |err[n−k]|, k can be positive or negative.

In one example, for C*x²[n]*x[n−1], the intervals for detection can be applied to err[n]. In another example C*x²[n−1]*x[n], the intervals for detection would be applied to err[n−1]. The different open intervals of the signal can include an open interval based on an amplitude of a leading or lagging sample of the error signal. The open intervals would be applied to a leading or lagging sample of the error signal, which is believed to be the data sample modulating the gain, or affecting the gain. In some embodiments, the correlation of the error signal for dealing with cross terms can be correlated with PN[n] or PN[n−1] (or some other leading/lagging sample of the 1-bit PN/RCAL signal).

This approach greatly simplifies the scheme dealing with cross terms, since the intervals are not defined based on a product of samples (which has a larger range), but just a leading or lagging sample of the error signal (which has a smaller range). However, this simplified scheme works best when neighboring samples, e.g., x[n] and x[n−1], are uncorrelated with each other (otherwise, non-cross terms and cross-terms of the same order would compete with each other). This requirement can be a strong restriction on the calibration scheme, but this assumption can be made if the circuit has a large dither injected to it to randomize x[n] or y[n], thereby making samples of x[n] or y[n] at different time instants uncorrelated with each other.

Figure 16:
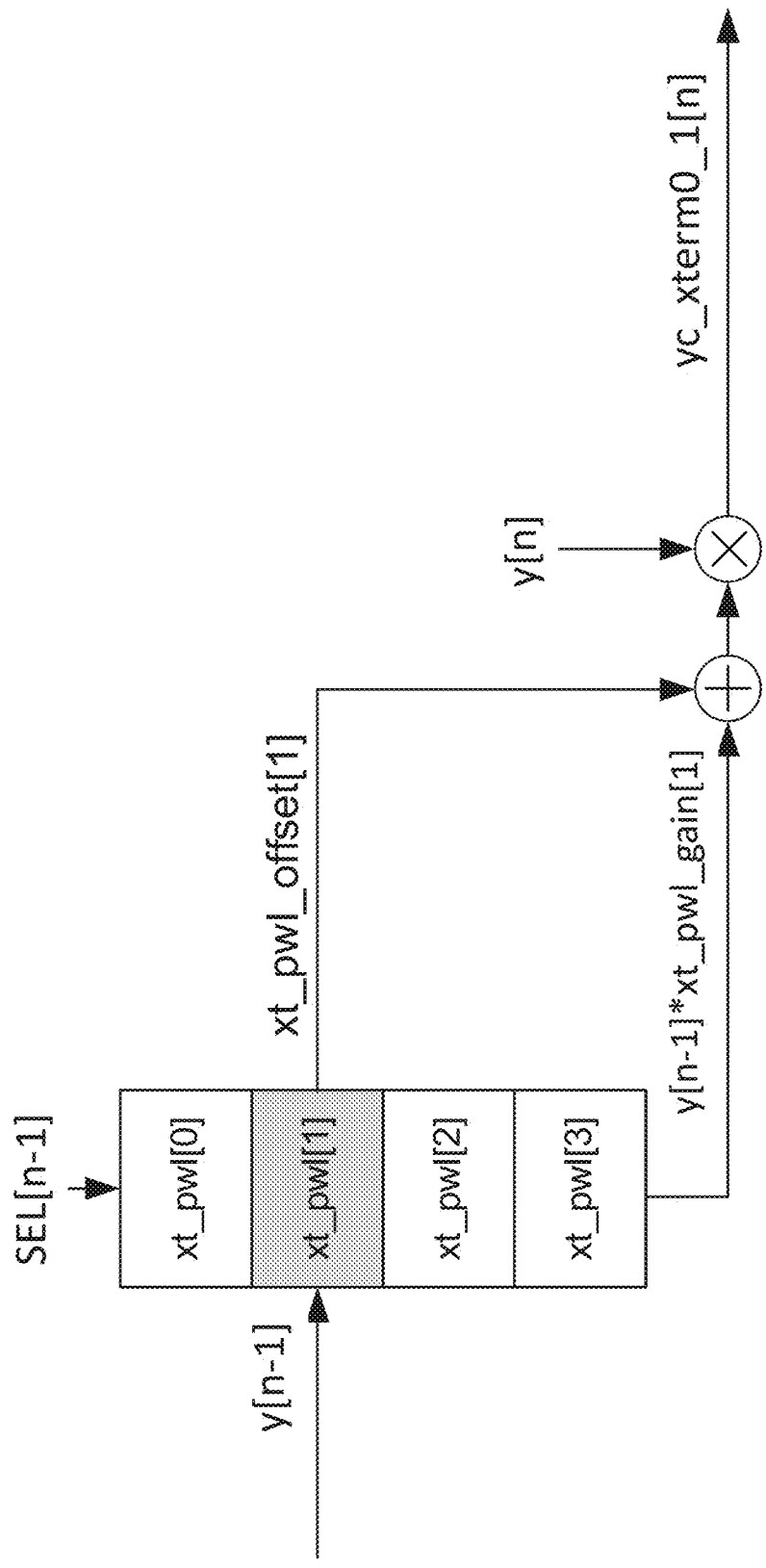
FIG. 16 illustrates an exemplary scheme for performing piecewise linear correction, according to some embodiments of the disclosure.

Correcting for non-linearities in a piecewise fashion based on this alternative scheme may need to avoid discontinuities between intervals using a different approach, as illustrated by FIG. 16. For correction of the cross terms, e.g., $x[n]*x^2[n-1]$ term, offsets may be computed to avoid jump discontinuities in the transfer function. For the cross term $x[n]*x^2[n-1]$, the correlation results can be filtered (i.e., sorted into open intervals) based on the amplitude of the error signal err[n-1]. First approach might be to scale y[n] by some multiplicative correction term that is selected by the output signal y[n-1], similar to what is performed in the example illustrated by FIG. 8, where the multiplicative correction term is selected by selected by amplitude of y[n]. However due to the unique nature of cross-terms (described earlier), this approach will introduce jump discontinuities as y[n-1] is swept across different intervals. Consider y[n] resting at some DC level. Initially y[n-1] is at 0 and y[n] is scaled by C1 (e.g., C1=1). Now y[n-1] increases past interval 1 trip point, causing y[n] to be scaled by C2 (e.g., C2=1.2). An offset correction term may be needed to avoid this discontinuity. Offset of (C1−C2)*y[n] would not work because C2*y[n]+(C1−C2)*y[n]=C1*y[n], hence such offset would have no effect. Solution is to scale y[n] by C1*y[n−1] instead of C1 directly. The resulting correction equation to correct for the $y[n]*y^2[n-1]$ would be y[n]*(C1*y[n−1]+OS1), where C1 is a multiplicative (gain) correction term and OS1 is an offset correction term selected when y[n−1] is in interval 1 of L. When y[n−1] is in a different interval, a different multiplicative (gain) correction term and a different offset correction term would be selected. Phrased differently, correction terms would be selected based on y[n−1] for $x[n]*x^2[n-1]$, or more generally, based on the signal which is modulating the gain for the particular cross term. Jump discontinuities are eliminated since (C1*y[n−1]+OS1) is now a continuous piecewise linear function that is multiplying the continuous y[n].

FIG. 16 illustrates an exemplary scheme for piecewise linear correction of cross-term non-linearities, according to some embodiments of the disclosure. For the exemplary cross-term $x[n]*x^2[n-1]$, the value of y[n−1] is multiplied by a multiplicative/gain correction term selected by a delayed selection signal SEL[n−1]. SEL[n] is generated from y[n]; SEL[n−1] would correspond to a selection signal generated based on the value of y[n−1]. The corresponding multiplicative/gain correction term is selected from the values in xt_pwl[ ]. The result of the multiplication, shown as "y[n−1]*xt_pwl_gain[1]" gets an additive offset correction term, shown as "xt_pwl_offset[1]". The corresponding additive offset correction term is selected also by the delayed selection signal SEL[n−1]. The result from the addition is therefore "y[n−1]*xt_pwl_gain[1]+xt_pwl_offset[1]". This result is multiplied by y[n], to complete the correction. The logic shown thus implements the correction equation to correct for the $x[n]*x^2[n-1]$ cross term, i.e., y[n]*(C*y[n−1]+OS), where C is a multiplicative (gain) correction term and OS is an offset correction term selected based on the interval in which y[n−1] falls.

Figure 17:
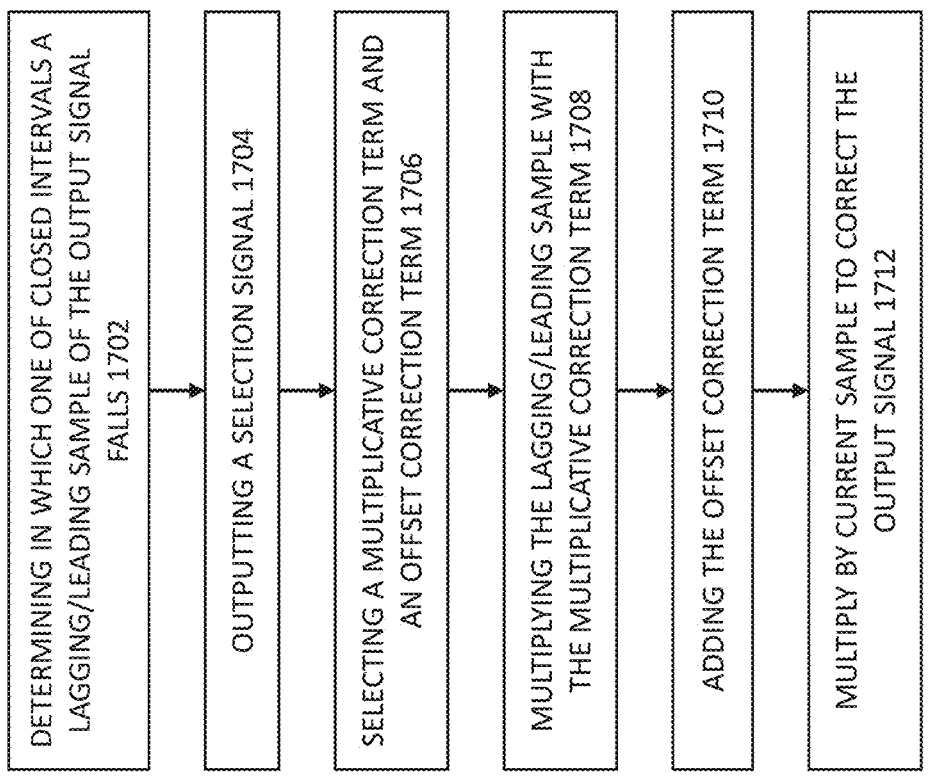
FIG. 17 is a flow diagram illustrating the method performed by the scheme shown in FIG. 16, according to some embodiments of the disclosure.

FIG. 17 is a flow diagram illustrating a method for piecewise linear correction of cross-term non-linearities, according to some embodiments of the disclosure. The method corresponds to the scheme illustrated in FIG. 16. In task 1702, a closed interval sorting block can determine in which one of the closed intervals a lagging or leading sample of the output signal falls. In task 1704, the closed interval sorting block can generate a selection signal, i.e., based on the amplitude or magnitude of the lagging or leading sample of the output signal. In some embodiments, tasks 1702 and 1704 can be implemented by applying a closed interval sorting block on the output signal, e.g., y[n], to generate a selection signal SEL[n]. Delay blocks can be used to delay the selection signal to obtain values such as SEL[n−2], SEL[n−1], SEL[n+1], SEL[n+2], etc. In task 1706, the selection signal selects a multiplicative correction term and an offset correction term. In task 1708, the lagging or leading sample of the output signal is multiplied by the multiplicative correction term. In task 1710, the offset correction term is added to the result of the multiplication. In task 1712, the result from task 1710 is multiplied by the current sample of the output signal to complete the correction of the output signal. While this example describes applying a correction to the output signal y[n] of lag=0 by starting with y[n−1], this scheme can also be applied to correcting the output signal having a different lag k, where SEL[n−1−k] would be used to select the correction terms, and the correction terms would be first applied to y[n−1−k]. Finally the result would be multiplied with y[n−k].

Variations and Implementations

Many examples described herein mentions sorting correlation results into different open intervals (e.g., FIG. 5) based on the amplitude/magnitude of the error signal that was used to generate the correlation results, and using the correlation results for one or more update loops. Since the open intervals overlap each other, this means that the sample only needs to be correlated (by digital hardware circuitry) with the pseudo-random signal once (i.e., requiring only one correlator), rather than multiple times. One skilled in the art would appreciate that it is possible to sort the error signal based on its amplitude, and perform separate correlations of the error signals with the 1-bit PN/RCAL signal, and then accumulate correlation results. In this implementation, a correlator is needed for each open interval.

Update loops or correction loops described herein can run in parallel.

Figure 18:
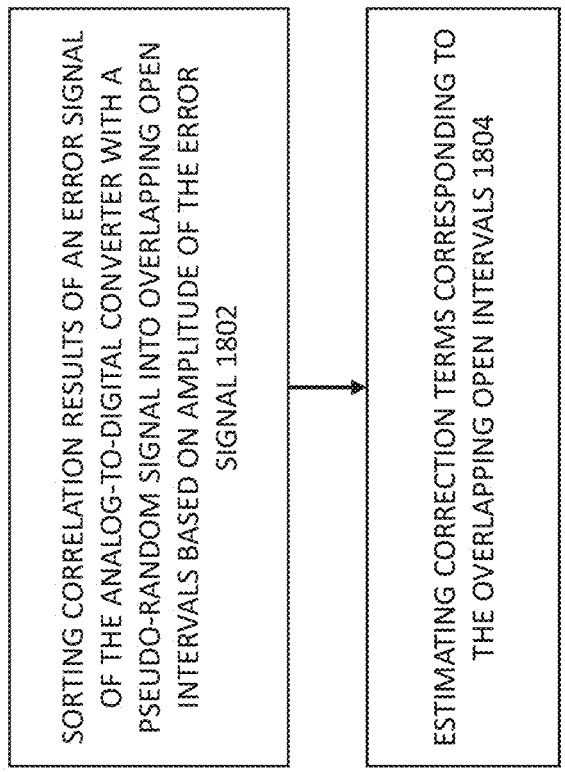
FIG. 18 is a flow diagram illustrating an exemplary method for determining correction terms, according to some embodiments of the disclosure.

Referring back to the example illustrated in FIG. 2, methods, systems, circuitry described herein can be used to estimate and calibrate various gain errors of the amplifier in a residue producing stage within a pipeline ADC. The calibration scheme, applying a piecewise detection scheme, can sort correlation results of an error signal of the analog-to-digital converter (e.g., the signal where the 1-bit PN/RCAL signal is removed from the residue) with a pseudo-random signal into overlapping open intervals based on amplitude of the error signal (task 1802 of FIG. 18) and estimates correction terms corresponding to the overlapping open intervals based on correlations results in each overlapping open interval, e.g., accumulated separately for each overlapping open intervals (task 1804 of FIG. 18). One or more update loops can run based on the separately accumulated correlations, binned based on the open intervals.

Although many examples describes a piecewise linear correction scheme being applied to the different open intervals, it is understood by one skilled in the art that other methods can be used for correcting the system. For instance, piecewise-splines can be used, or some other model can be applied to correct the signal based on the different information inferred separately from data collected in the open intervals.

It is understood by one skilled in the art that the schemes described herein estimates errors of the model, and based on the estimated errors, correction can be made using correction terms to compensate for non-linearities or other non-ideal characteristics of the circuit. Correction terms are used broadly herein to encompass errors, i.e., various terms of the model as well as the actual correction terms (e.g., gain correction multiplier, offset, value in a look up table) used for distorting the signal to compensate for the non-linearities or other non-ideal characteristics.

The schemes described herein are generally stable. In some cases, a large-dither (e.g., a multibit random signal) may be injected into the system to ensure that a full-scale signal is present and that the samples of the output would be roughly uncorrelated in time. The large-dither can improve the convergence speed of the schemes.

In some implementations, a known signal is used in place of the pseudo-random signal (i.e., in place of the 1-bit PN/RCAL signal). The known signal may be a special signal that can exercise the circuit or system to allow for errors or non-idealities to be measured.

While many of the examples describe how to calibrate a stage in a pipeline ADC, it is envisioned by the disclosure that the teachings can also be applied to line calibrate other non-ideal systems. For instance, the teachings can be used for calibrating an input buffer to a circuit, such as an ADC. A random signal (e.g., an 1-bit pseudo-randomized sequence) that is uncorrelated with an input signal can be injected into the buffer, and subsequently used for performing correlations with another signal of the circuit (e.g., an output signal or other suitable signal of the input buffer and/or the analog-to-digital converter) where the random signal is removed to determine non-idealities of the input buffer. The injected random signal can toggle on a same clock as the ADC so the two signals are synchronized to facilitate correlations and detection.

The examples described herein are merely illustrative examples of linearization and calibration in general. It is envisioned by the disclosure that the features described herein can also be applied to equalization in general for achieving a desired response. Specifically, correlations being performed in a piecewise fashion for different open intervals can be used for update equations that drive correction terms to achieve the desired response.

The present disclosure encompasses apparatuses which can perform the various methods described herein, including methods illustrated by FIGS. 4, 9, 11, 13, 14, 15, 17 and 18. Such apparatuses can include parts shown in FIGS. 2, 5, 6B, 7B, 8, 10A-D, 12A-B, 14A-C, and 16. Parts of various apparatuses for calibration can include electronic circuitry to perform the functions described herein. In some cases, one or more parts of the apparatus can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

Note that the activities discussed above with reference to the FIGURES are applicable to any integrated circuits that involve a residue producing stage or circuit, or more generally, to circuits which may have linear errors, memory/frequency dependent errors, static nonlinearity errors, Hammerstein-style non-linearity errors, and Wiener-style non-linearity errors (cross-terms). In certain contexts, the features discussed herein related to calibration can be applicable to applications where performance of the circuit is important. Examples of applications include medical systems, scientific instrumentation, wireless and wired communications systems, radar, industrial process control, audio and video equipment, instrumentation, and other systems which uses ADCs. The level of performance enabled by calibration schemes disclosed herein can be particularly beneficial to products and systems in demanding markets such as high speed communications, medical imaging, synthetic aperture radar, digital beam-forming communication systems, broadband communication systems, high performance imaging, and advanced test/measurement systems (oscilloscopes).

In the discussions of the embodiments above, the parts and components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of components of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the components of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the error calibration functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components or parts. However, this has been done for purposes of clarity and example only. It should be appreciated that the system can be consolidated in any suitable manner. Along similar design alternatives, any of the illustrated components, modules, blocks, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is also important to note that the functions configuring a time-interleaved ADC, illustrate only some of the possible functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure. Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for determining correction terms of a system, the method comprising:
    removing a pseudo-random signal injected in the system to obtain an error signal;
    performing correlations of the error signal with the pseudo-random signal; and
    updating correction terms based on the correlations accumulated based on different open intervals of the error signal.

2. The method of claim 1, wherein the pseudo-random signal is a 1-bit pseudo-random signal.

3. The method of claim 1, wherein the different intervals comprises: an interval including all samples, and an interval including samples whose absolute value is above a first predetermined threshold value.

4. The method of claim 1, wherein updating the correction terms based on the correlations comprises:
    updating the correction terms based on (1) correlations associated with an interval including all samples, and (2) correlations associated with an interval including samples whose absolute value is above a first predetermined threshold value.

5. The method of claim 1, wherein the different intervals comprise: an interval including all samples, an interval including samples whose values are above a first predetermined threshold value, and an interval including samples whose values are below a second predetermined threshold value.

6. The method of claim 1, wherein updating the correction terms based on the correlations comprises:
    updating the correction terms based on (1) correlations associated with an interval including samples whose values are above a first predetermined threshold value, and (2) correlations associated with an interval including samples whose values are below a second predetermined threshold value.

7. The method of claim 1, wherein the different open intervals comprises: an interval including all samples, and a plurality of intervals associated with different predetermined threshold values, each including samples whose absolute values are above a predetermined threshold value corresponding to a particular one of the intervals.

8. The method of claim 1, wherein two or more ones of the different open intervals overlap each other.

9. The method of claim 1, wherein updating the correction terms based on the correlations comprises:
    estimating piecewise linear correction terms based on the different open intervals.

10. The method of claim 1, wherein the correction terms comprises a gain coefficient and an offset for each open interval.

11. The method of claim 1, wherein performing correlations comprises:
    correlating the error signal with a lagging or leading sample of the pseudo-random signal.

12. The method of claim 1, wherein performing correlations comprises:
    correlating the error signal with a product of samples of the pseudo-random signal at a different time instants.

13. The method of claim 1, wherein the different open intervals of the error signal comprises an open interval based on an amplitude of a leading or lagging sample of the error signal.

14. The method of claim 1, wherein the different open intervals of the error signal comprises an open interval based on a product of samples of the error signal at different time instants.

15. A system for correcting a circuit generating an output signal, the system comprising:
- a circuit part to remove an injected signal, wherein the injected signal is uncorrelated with a signal being processed by the circuit to generate an error signal;
- threshold logic to determine whether the error signal falls with one or more open intervals;
- a correlation block to correlate the error signal with the injected signal; and
- one or more update loops for processing correlation results within one or more open intervals to generate correction terms for correcting the circuit.

16. The system of claim 14, wherein:
- the circuit part is a residue producing circuit in an analog-to-digital converter; and
- the injected signal is injected at an input of an amplifier of the residue producing circuit; and
- the correction terms are associated with gain errors of the amplifier.

17. The system of claim 14, further comprising:
- a digital-to-analog converter for generating the injected signal based on a one-bit pseudo random number sequence.

18. The system of claim 14, further comprising:
- a closed interval sorting block for determining in which one of closed intervals a sample of the output signal falls and outputting a selection signal to select one or more correction terms for linearizing the circuit part.

19. The system of claim 14, further comprising:
- a closed interval sorting block for determining in which one of closed intervals a sample of the output signal falls, outputting a selection signal, wherein the selection signal and one or more delayed versions of the selection signal each selects one or more correction terms for producing an intermediate value; and
- a combination block for combining the intermediate values for linearizing the circuit part.

20. An apparatus for determining correction terms of an analog-to-digital converter, the apparatus comprising
- means for sorting correlation results of an error signal of the analog-to-digital converter with a pseudo-random signal into overlapping open intervals based on amplitude of the error signal; and
- means for estimating correction terms corresponding to the overlapping open intervals based on correlations results in each overlapping open interval.

* * * * *